(12) United States Patent
Mihara et al.

(10) Patent No.: US 6,385,086 B1
(45) Date of Patent: May 7, 2002

(54) NONVOLATILE SEMICONDUCTOR MEMORY DEVICE CAPABLE OF HIGH SPEED GENERATION OF REWRITE VOLTAGE

(75) Inventors: Masaaki Mihara; Yoshikazu Miyawaki; Shinji Kawai, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/735,618

(22) Filed: Dec. 14, 2000

(30) Foreign Application Priority Data

Jun. 13, 2000 (JP) .................................. 2000-176614

(51) Int. Cl.$^7$ ............................................... G11C 16/04
(52) U.S. Cl. ............................ 365/185.11; 365/189.09; 365/226
(58) Field of Search ..................... 365/185.18, 189.11, 365/226, 189.01, 185.01

(56) References Cited

U.S. PATENT DOCUMENTS

| | | | | |
|---|---|---|---|---|
| 6,014,322 A | * | 1/2000 | Roohparvar | 365/185.33 |
| 6,141,262 A | * | 10/2000 | Sudo | 365/189.09 |
| 6,154,412 A | * | 11/2000 | Ishikawa | 365/226 |
| 6,181,629 B1 | * | 1/2001 | Ogura | 365/227 |
| 6,229,740 B1 | * | 5/2001 | Ogura | 365/189.11 |

FOREIGN PATENT DOCUMENTS

JP    1-117427    5/1989

* cited by examiner

*Primary Examiner*—Hoai V. Ho
(74) *Attorney, Agent, or Firm*—McDermott, Will & Emery

(57) ABSTRACT

A voltage generation portion includes a voltage amplifier circuit, receiving a boosted potential VPP generated by a charge pump circuit to output an output potential Vout equal to a standard potential VIN. Output potentials Vout are distributed as voltages for rewriting and erasing on a flash memory via distributor. The output potential Vout can be changed faster than the boosted potential VPP generated by the charge pump circuit does.

14 Claims, 36 Drawing Sheets

FIG. 5

| S2 | S1 | S0 | VIN[V] |
|---|---|---|---|
| H | H | H | 10.00 |
| H | H | L | 8.75 |
| H | L | H | 7.50 |
| H | L | L | 6.25 |
| L | H | H | 5.00 |
| L | H | L | 3.75 |
| L | L | H | 2.50 |
| L | L | L | 1.25 |

FIG. 29

| S2 | S1 | S0 | ND11[V] | ND12[V] | ND13[V] | ND14[V] | ND21[V] | ND22[V] | VIN[V] |
|---|---|---|---|---|---|---|---|---|---|
| H | H | H | 2.50 | 5.00 | 7.50 | 10.00 | 5.00 | 10.00 | 10.00 |
| H | H | L | 1.25 | 3.75 | 6.25 | 8.75 | 3.75 | 8.75 | 8.75 |
| H | L | H | 2.50 | 5.00 | 7.50 | 10.00 | 2.50 | 7.50 | 7.50 |
| H | L | L | 1.25 | 3.75 | 6.25 | 8.75 | 1.25 | 6.25 | 6.25 |
| L | H | H | 2.50 | 5.00 | 7.50 | 10.00 | 5.00 | 10.00 | 5.00 |
| L | H | L | 1.25 | 3.75 | 6.25 | 8.75 | 3.75 | 8.75 | 3.75 |
| L | L | H | 2.50 | 5.00 | 7.50 | 10.00 | 2.50 | 7.50 | 2.50 |
| L | L | L | 1.25 | 3.75 | 6.25 | 8.75 | 1.25 | 6.25 | 1.25 |

FIG. 31

| S2 | S1 | S0 | ND11[V] | ND12[V] | ND13[V] | ND14[V] | ND21[V] | ND22[V] | VIN[V] |
|---|---|---|---|---|---|---|---|---|---|
| H | L | L | 1.25 | 5.00 | 6.25 | 10.00 | 1.25 | 10.00 | 10.00 |
| H | L | H | 2.50 | 3.75 | 7.50 | 8.75 | 2.50 | 8.75 | 8.75 |
| H | H | H | 2.50 | 3.75 | 7.50 | 8.75 | 3.75 | 7.50 | 7.50 |
| H | H | L | 1.25 | 5.00 | 6.25 | 10.00 | 5.00 | 6.25 | 6.25 |
| L | H | L | 1.25 | 5.00 | 6.25 | 10.00 | 5.00 | 6.25 | 5.00 |
| L | H | H | 2.50 | 3.75 | 7.50 | 8.75 | 3.75 | 7.50 | 3.75 |
| L | L | H | 2.50 | 3.75 | 7.50 | 8.75 | 2.50 | 8.75 | 2.50 |
| L | L | L | 1.25 | 5.00 | 6.25 | 10.00 | 1.25 | 10.00 | 1.25 |

FIG. 33

| L2 | L1 | L0 | VPP | ND66[V] | ND65[V] | ND63[V] | ND59[V] |
|---|---|---|---|---|---|---|---|
| H | H | H | 10.000 | 10.000 | 9.375 | 8.125 | 5.625 |
| H | H | L | 9.375 | 9.375 | 9.375 | 8.125 | 5.625 |
| H | L | H | 8.750 | 8.750 | 8.125 | 8.125 | 5.625 |
| H | L | L | 8.125 | 8.125 | 8.125 | 8.125 | 5.625 |
| L | H | H | 7.500 | 7.500 | 6.875 | 5.625 | 5.625 |
| L | H | L | 6.875 | 6.875 | 6.875 | 5.625 | 5.625 |
| L | L | H | 6.250 | 6.250 | 5.625 | 5.625 | 5.625 |
| L | L | L | 5.625 | 5.625 | 5.625 | 5.625 | 5.625 |

ERASE

ERASE

NONVOLATILE SEMICONDUCTOR MEMORY DEVICE CAPABLE OF HIGH SPEED GENERATION OF REWRITE VOLTAGE

BACKGROUND OF THE INVENTION

1. Field of the Invention

The present invention relates to a nonvolatile semiconductor memory device and particularly, to a nonvolatile semiconductor memory device including an amplifier circuit outputting power supply potentials at a plurality of levels covering from a voltage higher than an external power supply potential to the ground potential.

2. Description of the Background Art

In recent years, nonvolatile semiconductor memory devices have been adopted for data storage in company with proliferation of portable information equipments in industrial and consumer uses. One of nonvolatile semiconductor devices is a flash memory.

In a memory cell of a flash memory, information of "0" or "1" is stored by injection into or extraction from a floating gate holding electrons. When such injection or extraction of electrons is effected, there arises a need to apply high voltages at a plurality of levels on a memory cell.

Below, description will be given of a case where a plurality of different potentials are applied on a memory cell of a NOR memory as an example.

FIG. 34 is a conceptual diagram for describing a programming operation on a memory cell.

Referring to FIG. 34, a word line WL0 is set to about 8 V and word lines WL1 to WL3 are set to 0 V. A sub-bit line SBL1 is set to 4 V and a sub-bit line SBL0 is set to 0 V. Further, a well in which a memory block to be programmed is formed is set to 0 V and a Source line SL is set to 0 V.

With such settings, a memory transistor connected to the word line WL0 and the sub-bit line SBL1 is selected. Electrons are injected into the floating gate of the selected memory transistor to hold a data "0" therein.

FIG. 35 is a schematic sectional view for describing a programming operation on the selected cell of FIG. 34.

Referring to FIG. 35, about 8 V of a high positive voltage is applied on the word line WL and about 4 V of a positive voltage is applied on the sub-bit line SBL. In this state, potentials of a P well and the source line SL are set to 0V and thereby, electrons are injected from the P well and the source S into the floating gate F. By injecting the electrons, a threshold voltage Vth of the selected memory transistor changes up to about 6 V or higher; which operation is a programming operation.

It should be appreciated that, for convenience in description, an impurity region connected to the source line SL is referred to as a source S and further, an impurity region facing the source S with a channel region interposed therebetween is referred to as a drain D.

FIG. 36 is a conceptual circuit diagram for describing an erase operation on a memory cell.

Referring to FIG. 36, when an erase operation is performed, the word lines WL0 to WL3 in a block to be erased are collectively set to about −10V. On the other hand, a potential of a well in which the memory block to be erased is formed is set to about 8 V and the source line SL is also set to about 8 V. Further, the sub-bit line SBL connected to the memory block to be erased is set to the open state by setting a selected gate to the non-conductive state.

In such settings, memory transistors residing in the same well are collectively applied with a high electric field. Electrons are extracted from the floating gates of the memory transistors in the memory blocks to be erased, and an erase operation is effected that a threshold voltage Vth of each memory transistor is collectively reduced down to a voltage of the order ranging from 1 V to 3 V from the high state.

FIG. 37 is a schematic sectional view for describing a potential set on each memory transistor in an erase operation.

Referring to FIG. 37, the gate G of the memory transistor is set to about −10 V through the word line WL. The source S is set to about 8 V through the source line SL. The drain D is in the open state since the sub-bit line SBL is disconnected from a main bit line MBL. Further, the P well is set to about 8 V.

With such potential settings, electrons are extracted from the floating gate F into the P well and the source S and a threshold voltage Vth of the memory transistor, which has been 6 V or higher, Changes to a value ranging from 1 to 3 V, that is the memory transistor is put into the erased state.

A high voltage applied on a memory cell is generally generated by a charge pump circuit incorporated within a semiconductor memory device.

FIG. 38 is a block diagram for describing a conventional configuration whereby a plurality of high voltages are generated.

Referring to FIG. 38, a charge pump circuit 952 outputs an output potential Vout obtained by receiving and boosting a power supply potential Vcc supplied externally and the ground potential. The output potential Vout is monitored by a potential detection circuit 954. The potential detection circuit 954 compares a potential specified by a control signal SET supplied from a control portion of the semiconductor memory device and the output potential of the charge pump circuit 952 with each other. When the output potential Vout is lower than the specified potential, the potential detection circuit 954 drives the charge pump circuit 952. On the other hand, when the output potential Vout rises to be higher than the specified potential, the potential detection circuit 954 ceases the operation of the charge pump circuit 952.

When high voltages at a plural levels are necessary, it is not justified from the view point of integration to incorporate charge pump circuits for the respective voltages into the memory device. Further, when a configuration and operation are adopted in which control signals SET provided from a control portion are switched over to switch potentials detected by the voltage detection circuit 954 over and attain a plurality of high potentials, using a single charge pump circuit, it takes a long time to stabilize an output potential Vout.

SUMMARY OF THE INVENTION

An object of the present invention is to provide a nonvolatile semiconductor memory device including a voltage amplifier circuit that can receive an output of a single charge pump circuit or outputs of charge pump circuits whose number is smaller than a necessary number of potential levels as a power supply potential or power supply potentials to generate a plurality of output potentials.

Briefly stated, the present invention provides a nonvolatile semiconductor memory device including: a memory array; a control portion and a voltage generation portion.

The memory array includes a plurality of memory cells, arranged in a matrix pattern, and each holding a data in a nonvolatile fashion. The control portion performs control of voltage application on a plurality of memory cells according to an instruction supplied externally. The voltage generation portion outputs a first internal potential applied on the plurality of memory cells in erasure and rewriting of the data from an output node thereof according to an output of the control portion.

The voltage generation portion includes: a booster circuit raising a first power supply potential to output a second power supply potential; a standard potential generation portion generating a second internal potential according to an instruction of the control portion; and a voltage amplifier circuit receiving the second power supply potential and transmitting the first internal potential to the output node according to the second internal potential.

The voltage amplifier circuit includes: a standard potential input portion receiving the second internal potential to output a third internal potential; and a drive portion driving a potential at the output node according to the third internal potential.

The standard potential input portion includes: a first field effect transistor whose source is coupled to the second internal potential, and whose drain and gate are coupled to the third internal potential; and a first current source, provided between a first internal node applied with a prescribed power supply potential and the first field transistor, and supplying a prescribed first bias current to the first field effect transistor.

The drive portion includes: a second field effect transistor whose gate is connected to the gate of the first field effect transistor, and which is provided on a path connecting a second internal node applied with a prescribed power supply potential and the output node.

Accordingly, a main advantage of the present invention is that a power supply potential applied on a memory cell can be switched over at a high speed and thereby, the nonvolatile semiconductor memory device becomes faster in operating speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a table showing a relation between an input control signal to the standard potential generation circuit 48 and an output standard potential therefrom;

FIG. 29 is a table for describing changes in nodes in the case of sequential counting-up of control signals S2, S1 and S0;

FIG. 31 is a table showing a relation between potentials of nodes of the standard potential generation circuit 848 shown in FIG. 30 and the control signals S0 to S2;

FIG. 33 is a table for describing operation of the standard potential generation circuit shown in FIG. 32;

DESCRIPTION OF THE PREFERRED EMBODIMENTS

Below, detailed description will be given of embodiments of the present invention with reference of the accompanying drawings, wherein the same marks denote the same or corresponding constituents.

First Embodiment

Figure 1:
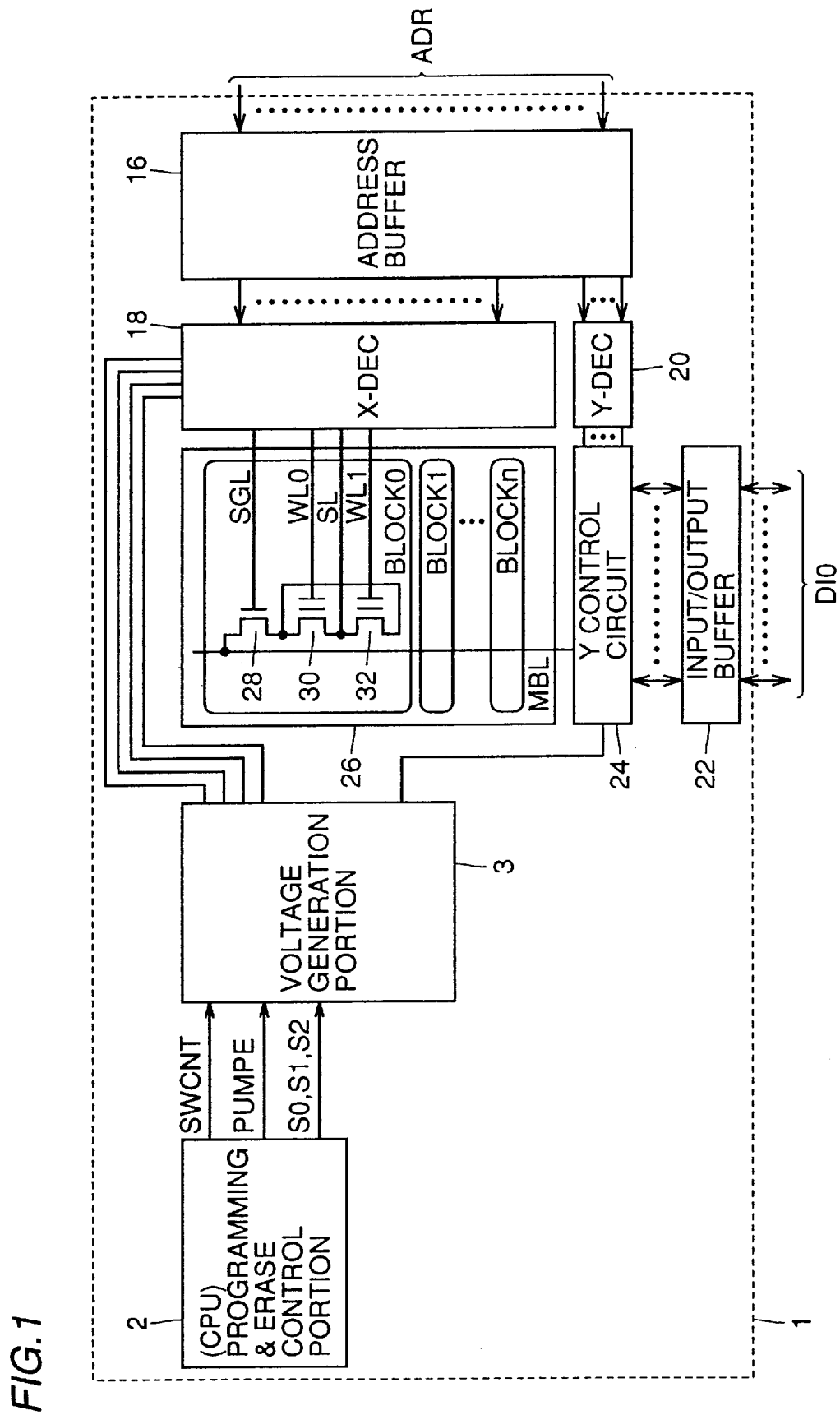
FIG. 1 is a block diagram schematically showing a configuration of a nonvolatile semiconductor memory device 1 of the present invention.

FIG. 1 is a block diagram schematically showing a configuration of a nonvolatile semiconductor memory device 1 of the present invention.

Referring to FIG. 1, a nonvolatile semiconductor memory device 1 includes: a program & erase control portion 2 including ROM and performing a control of programming and erasure according to a program code stored in the ROM; a voltage generation portion 3, receiving a switch control signal SWCNT, a pump enable signal PUMPE and potential control signals S0, S1 and S2 from the program & erase control portion 2, and according to the received signals, generating an output potential to output; an address buffer 16 receiving an address signal ADR externally; a select gate line SGL, receiving an internal address signal from the address buffer 16, and receiving supply of a potential from the voltage generation portion 3; an X decoder 18 determining potentials of word lines WL0 and WL1, a source line SL and a well, respectively; an input/output buffer 22 for supplying and receiving data input/output signals DIO; a Y decoder 20 receiving an address signal from the address buffer 16 to decode the signal; and a Y control circuit 24 applying a high voltage on a main bit line MBL corresponding to a data input/output signal according to an output of the Y decoder 20.

The X decoder includes: a WL decoder for selecting a word line; a SG decoder for selecting a select gate; a WELL decoder selecting a well region corresponding to a selected memory block; and a SL decoder for selecting a source line, which are not shown in the figure.

The Y control circuit 24 includes: a YG & sense amplifier and a latch circuit selecting a column in reading to perform a reading operation with a sense amplifier; and a page buffer determining whether or not a high potential is applied on the main bit line MBL in programming, based on a latched data.

The nonvolatile semiconductor memory device 1 further includes: a memory array 26. The memory array 26 includes: memory blocks BLOCK0 to BLOCKn formed in the interior of wells, each being isolated from the others.

The memory block BLOCK0 includes: memory cells 30 and 32 and a select gate 28. In the memory block BLOCK0, there are selected memory cells corresponding the select gate line SGL, the word lines WL0, WL1 and the source line SL, selected by the X decoder 18, and a signal corresponding to a data from the main bit line MBL data is received to hold the data on a selected memory cell. In FIG. 1, there are typically shown the select gate 28, memory cells 30 and 32, corresponding to the select gate line SGL, the word lines WL0, WL1 and the source line SL, all having been selected.

Figure 2:
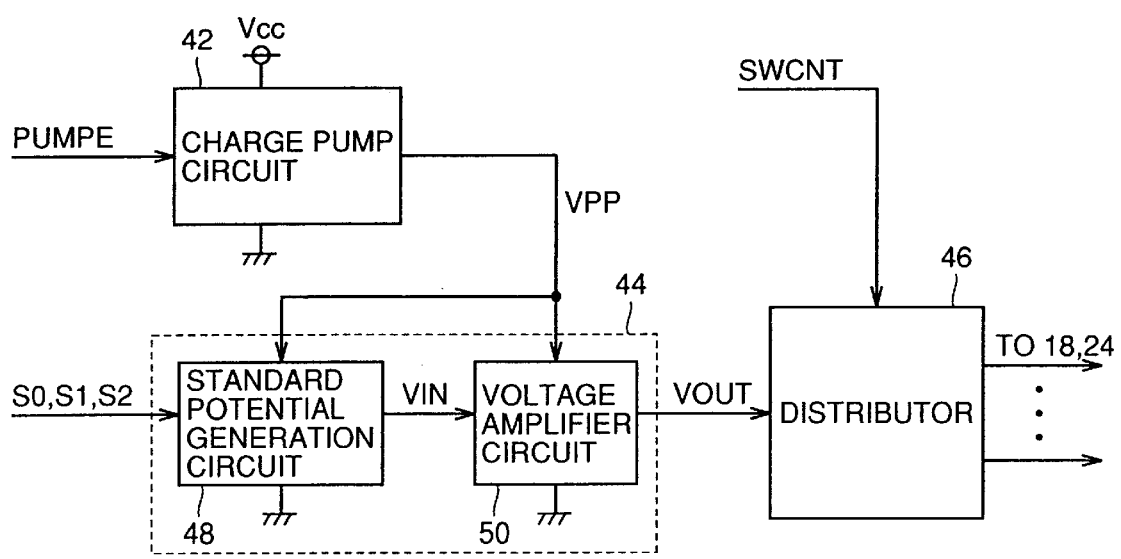
FIG. 2 is a block diagram representing a configuration of the voltage generation portion 3 of FIG. 1.

FIG. 2 is a block diagram representing a configuration of the voltage generation portion 3 of FIG. 1.

Referring to FIG. 2, the voltage generation portion 3 includes: a charge pump circuit 42, receiving a pump enable signal PUMPE from the program & erase control portion 2 to output a boosted potential VPP obtained from the power supply potential Vcc supplied in the interior; a standard potential generation circuit 48, receiving the boosted potential VPP to output a standard potential VIN according to control signals S0, S1 and S2 supplied from the program & erase control portion 2; a voltage amplifier circuit 50, receiving the standard potential VIN to output an output potential Vout for driving equal to the standard potential VIN; and a distributor 46 for distributing the output potentials Vout to the X decoder 18, the Y control circuit 24 and the like according to switch control signals SWCNT supplied from the program & erase control portion 2. The standard potential generation circuit 48 and the voltage amplifier circuit 50 output high potentials Vout to be supplied on a word line and a well of the flash memory, obtained from the boosted potential VPP, according to the control signals S0, S1 and S2, and the program and erase modes.

Figure 3:
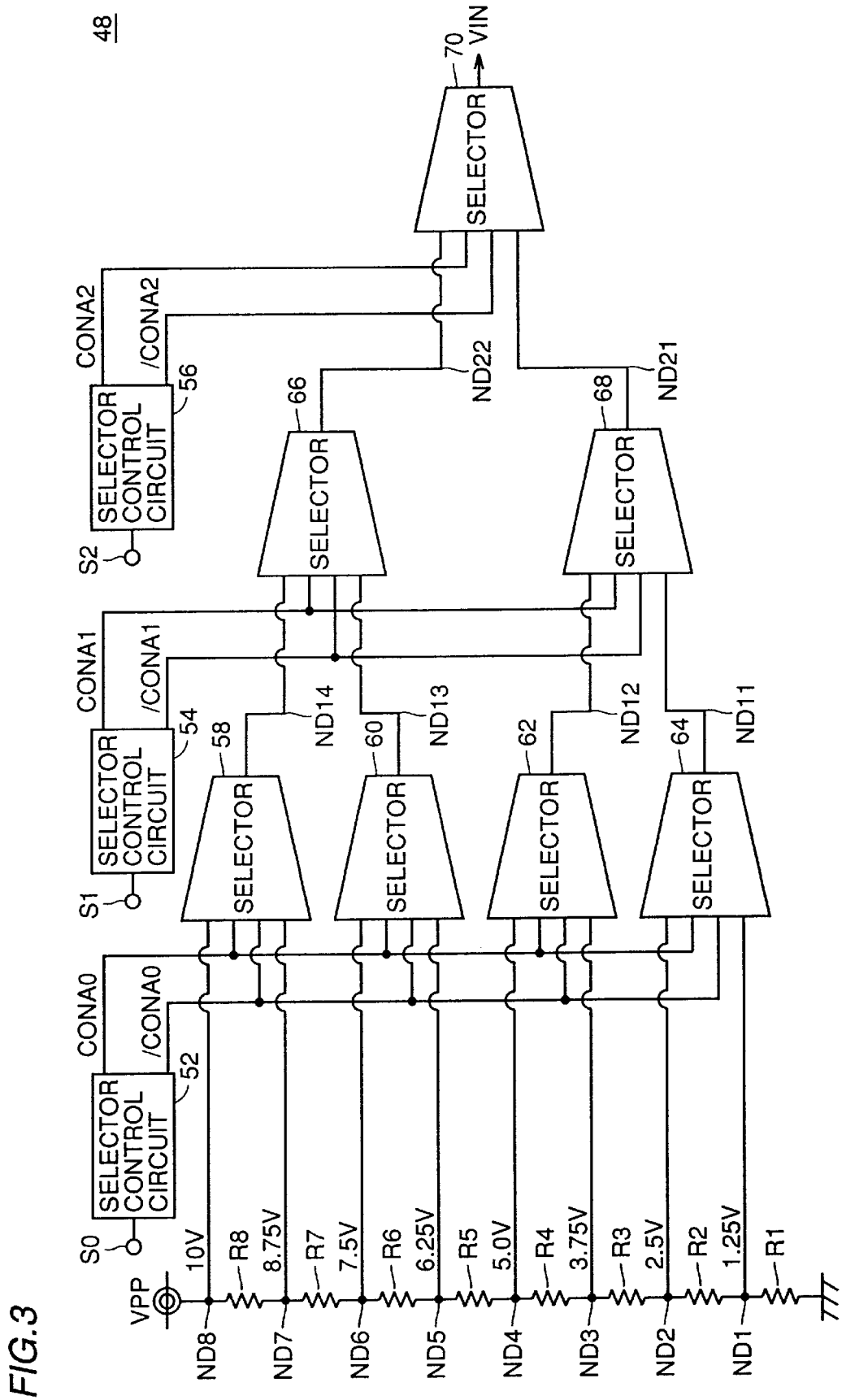
FIG. 3 is a circuit diagram representing a configuration of the standard potential generation circuit 48 of FIG. 2.

FIG. 3 is a circuit diagram representing a configuration of the standard potential generation circuit 48 of FIG. 2.

Referring to FIG. 3, the standard potential generation circuit 48 includes: a divider circuit constructed of registers R8 to R1 connected serially between a node ND8 provided with the boosted potential VPP and a ground node; a selector control circuit 52 receiving the control signal S0 to output control signals CONA0 and /CONA0 for switching over a selector; and selectors 58 to 64 switching over an output according to the control signals CONA0 and /CONA0. When the boosted potential VPP is 10V, potentials at connection nodes between the resistors R8 to R0 are as follows: a potential at a connection node ND1 between the resistors R1 and R2 is 1.25 V, a potential at a connection node ND2 between the resistors R2 and R3 is 2.5 V, a potential at a connection node ND3 between the resistors R3 and R4 is 3.75 V, a potential at a connection node ND3 between the resistors R4 and R4 is 5.0 V, a potential at a connection node ND5 between the resistors R5 and R6 is 6.25 V, a potential at a connection node ND6 between the resistors R6 and R7 is 7.5 V, and a potential at a connection node ND7 between the resistors R7 and R8 is 8.75 V.

The selector 58 outputs one of the potentials at the nodes ND7 and ND8 to the node ND14 according to the control signals CONA0 and /CONA0. The selector 60 outputs one of the potentials of the nodes ND5 and ND6 to the node ND13. The selector 62 outputs one of the potentials of the nodes ND3 and ND4 to the node ND12. The selector 64 outputs one of the potentials of the nodes ND1 and ND2 to the node ND11.

The standard potential generation circuit 48 further includes: a selector control circuit 54, receiving the control signal S1 to output the control signals CONA1 and /CONA1 which switch selectors; a selector 66 outputting one of potentials at the nodes ND13 and ND14 to a node ND22 according to the control signal CONA1 and /CONA1; and a selector 68 outputting one of potentials at the nodes ND11 and ND12 to a node ND21 according to the control signal CONA1 and /CONA1.

The standard potential generation circuit 48 further includes: a selector control circuit 56, receiving the control signal S2 to output the control signals CONA2 and /CONA2 which switch a selector; and a selector 70, outputting one of potentials at nodes ND21 and ND22 as the standard potential VIN according to the control signal CONA2 and /CONA2.

For example, when the boosted potential VPP is 10V and resistance values of the resistors R1 to R8 are all selected to be 50 kΩ, then potentials at the nodes ND1 to ND7 are obtained by voltage division over equal resistance values, wherein a current flowing through the resistors R1 to R8 is 25 μA. The standard potential generation circuit 48 shown in FIG. 3 is a circuit to function such that one of potentials at eight connection nodes between the resistors R1 to R8 is selected to obtain the standard potential VIN.

Eight graded voltage outputs supplied form a divider circuit constructed of the resistors R1 to R8 are selectively reduced to 4 potentials by the selectors 58 to 64, further selectively reduced to 2 potentials by the selectors 66 and 68 cascaded to the selectors 58 to 64 and finally, selectively reduced to one potential by the selector 70 cascaded to the selectors 66 and 68. In such a way, the graded potentials are sequentially selected at successive stages so as to reduce the number thereof to a final one in a hierarchical structure constructed of cascaded selector layers, thereby enabling a configuration of the selector control circuit to be simple.

Figure 4:
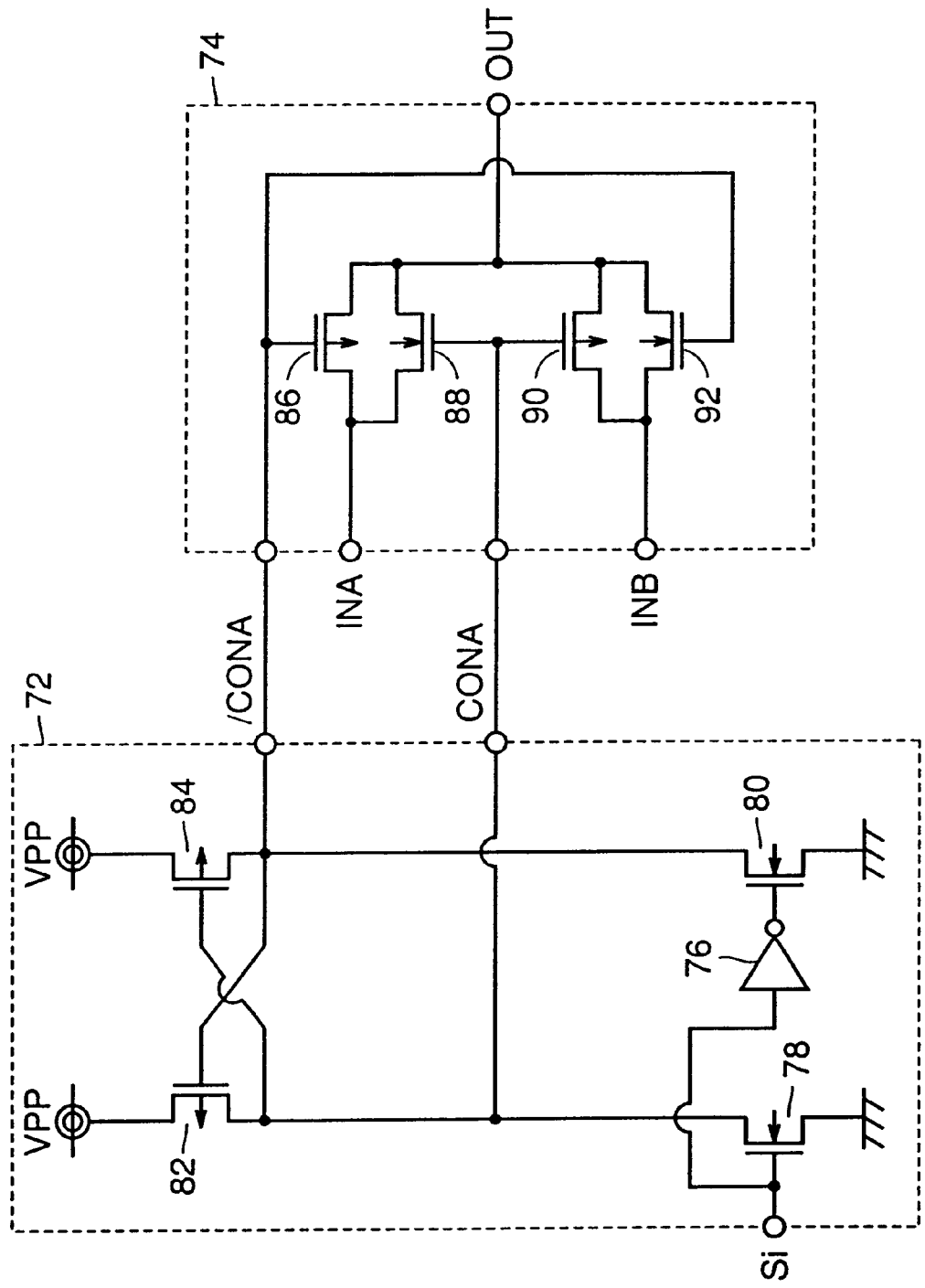
FIG. 4 is a circuit diagram example of the selector control circuit and the selector used in FIG. 3.

FIG. 4 is an example of circuit of the selector control circuit and the selector used in FIG. 3.

Referring to FIG. 4, a selector control circuit 72 receives the control signal Si and outputs the control signal CONA and /CONA. A selector 74 outputs one of input signals INA and INB as an output signal OUT according to the control signals CONA and /CONA.

The selector control circuit 72 includes: an N channel MOS transistor 78 that receives the control signal Si at the gate thereof, and whose source is connected to a ground node; an inverter 76, receiving the control signal Si to invert it; an N channel MOS transistor 80 that receives an output of the inverter 76 at the gate thereof, and whose source is connected to a ground node; a P channel MOS transistor 82, whose source is connected to the boosted potential VPP, whose drain is connected to the drain of the N channel MOS transistor 78, and whose gate is connected to the drain of the N channel MOS transistor 80; and a P channel MOS transistor 84, whose source is coupled to the boosted potential VPP, whose drain is connected to the drain of the N channel MOS transistor 80, and whose gate is connected to the drain of the N channel MOS transistor 78. The control signal CONA is outputted from the drain of the N channel MOS transistor 78 and the control signal /CONA is outputted from the drain of the N channel MOS transistor 80.

The selector 74 includes: a P channel MOS transistor 86 and an N channel MOS transistor 88, connected in parallel to each other, conductive when /CONA is at H level, to transmit the input signal INA as the output signal OUT. The control signal /CONA is connected to the gate of the P channel MOS transistor 86 and the control signal CONA is connected to the gate of the N channel MOS transistor 88.

The selector 74 further includes: a P channel MOS transistor 90 and an N channel MOS transistor 92, connected in parallel to each other, conductive when the control signal /CONA is at L level to transmit the input signal INB as the output signal OUT. The control signal CONA is connected to the gate of the P channel MOS transistor 90 and the control signal /CONA is connected to the gate of the N channel MOS transistor 92.

A parallelly connected pair of the P channel MOS transistor 86 and the N channel MOS transistor 88 are generally called an analogue switch and has a function of forcing two nodes to be conductive therebetween or cutting off two nodes from each other. A P channel MOS transistor and an N channel MOS transistor are used as a pair and thereby, can transmit potentials ranging from the ground potential to the power supply potential without any drop equal to the magnitude of a threshold voltage. Further, a parallelly connected pair of the P channel MOS transistor 90 and the N channel MOS transistor 92 constitute an analogue switch.

When the input signal Si of the selector control circuit 72 is at H level (Vcc), the control signal CONA goes to 0 V and a potential of the control signal /CONA is set to the boosted potential VPP. At this time, the signal INA is outputted as the output signal OUT. On the other hand, when the control signal Si is at L level, the input signal INB is outputted as the output signal OUT.

In the configuration in which a plural number of the 2-input, 1-output selector shown in FIG. 4 are cascaded in three stages, the standard potential generation circuit 48 shown in FIG. 3 selects one standard potential VIN from the potentials at the 8 nodes.

FIG. 5 is a figure showing a relation between an input control signal to the standard potential generation circuit 48 and an output standard potential therefrom.

Referring to FIG. 5, when the control signals (S2, S1 and S0) are at (H, H and H), respectively; (H, H and L), respectively; (H, L and H), respectively; (H, L and L), respectively; (L, H and H), respectively; (L, H and L), respectively; (L, L and H), respectively; and (L, L and L), respectively, then the respective standard potentials VIN are 10.00 V, 8.75 V, 7.50 V, 6.25 V, 5.00 V, 3.75 V, 2.50 V and 1.25 V.

In order to output the standard potentials shown in FIG. 5, a single 8-input, 1-output selector may be directly adopted as a one-stage configuration instead of the three-stage connection. However, in the former configuration, each of analogue switches requires a selector control circuit shown in FIG. 4. For this reason, the three-stage connection as shown in FIG. 3 is adopted and thereby, an output of a selector control circuit can be commonly used in a plurality of selectors, such that the number of element of selector control circuits can be reduced, which is effective for down-sizing of a layout area. Therefore, as can be seen from the above description, the multi-stage configuration is better than the one-stage configuration, whereas which of the configurations should be adopted is determined according to a margin in layout area and so forth when a layout is designed.

Figure 6:
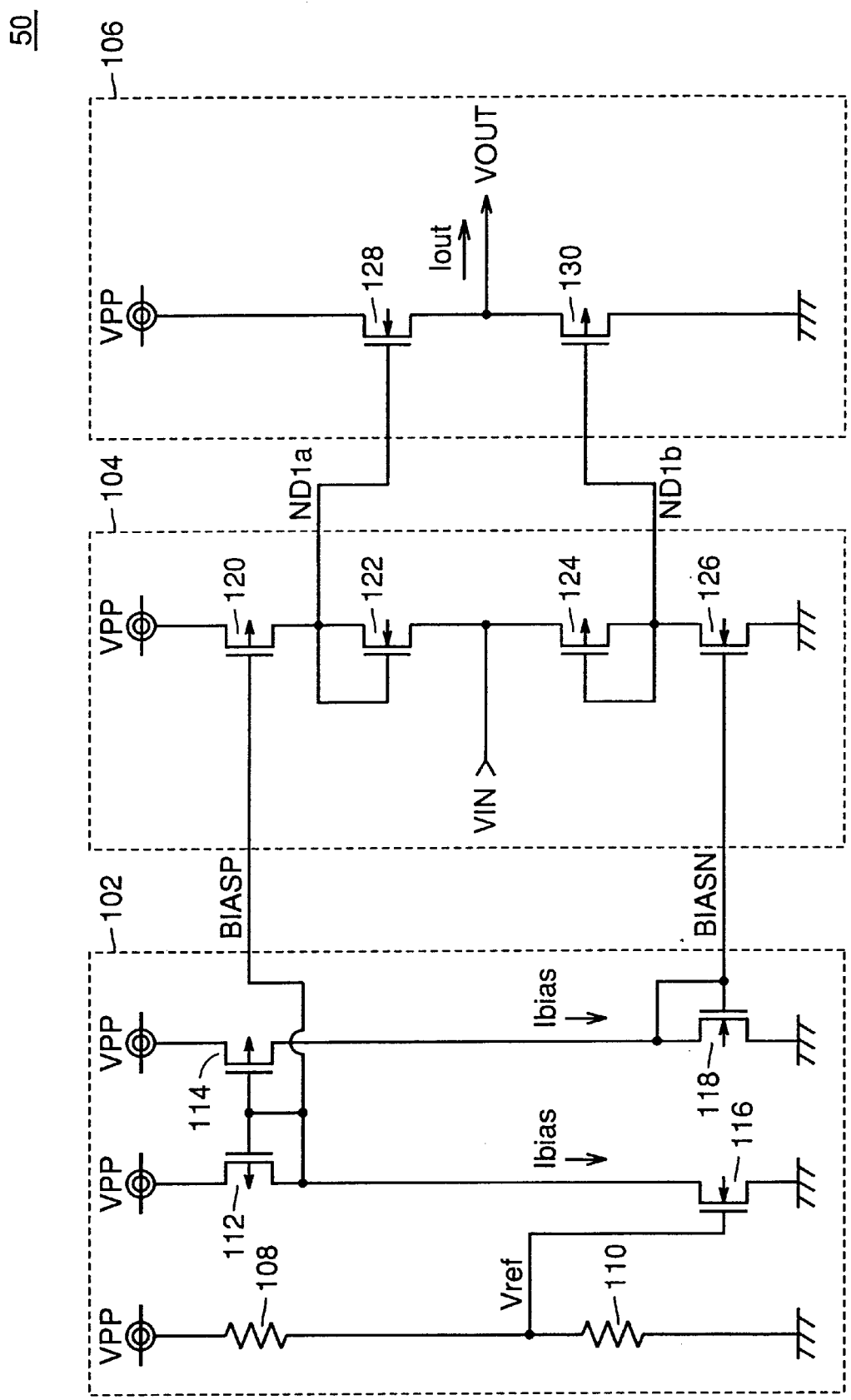
FIG. 6 is a circuit diagram representing a configuration of the voltage amplifier circuit 50 of FIG. 2.

FIG. 6 is a circuit diagram representing a configuration of the voltage amplifier circuit 50 of FIG. 2.

Referring to FIG. 6, the voltage amplifier circuit 50 includes: a bias voltage generation circuit 102 outputting bias voltages BIASP and BIASN; a standard potential input portion 104 receiving the standard potential VIN; and a drive portion 106 receiving an output of the standard potential input portion 104 to output the output voltage Vout.

The bias voltage generation portion 102 includes: resistors 108 and 110 connected serially between a node supplied with the boosted potential VPP and a ground node; an N channel MOS transistor 116 that receives a reference potential Vref outputted from a connection node between resistors 108 and 110 at the gate thereof, whose source is coupled to the ground potential; a P channel MOS transistor 112, whose source is coupled to the boosted potential VPP, and whose gate and drain are connected to the drain of the N channel MOS transistor 116; a P channel MOS transistor 114, whose source is coupled to the boosted potential VPP, and whose gate is connected to the drain of the N channel MOS transistor 116; and an N channel MOS transistor 118 that is connected between the drain of the P channel MOS transistor 114 and a ground node, and whose gate is connected to the drain of the P channel MOS transistor 114.

The bias voltage BIASP is outputted from the drain of the N channel MOS transistor 116 and the bias voltage BIASN is outputted from the drain of the N channel MOS transistor 118.

The standard potential input portion 104 includes: a P channel MOS transistor 120 that receives the bias voltage BIASP at the gate thereof, and which is connected between a node provided with the boosted potential VPP and a node ND1a; an N channel MOS transistor 122 whose gate and drain are connected to the node ND1a; a P channel MOS transistor 124, whose gate and drain are connected to a node ND1b, and whose source is connected to the source of the N channel MOS transistor 122; and an N channel MOS transistor 126 that is connected between the node ND1b and a ground node, and which receives the bias voltage BIASN at the gate thereof. The standard potential VIN is supplied to the sources of the N channel MOS transistor 122 and the P channel MOS transistor 124.

The drive portion 106 includes: an N channel MOS transistor 128, whose gate is connected to the ND1a, and whose drain is coupled to the boosted potential VPP; and a P channel MOS transistor 130, whose gate is connected the node ND1b, and whose drain is connected to a ground node. The sources of the N channel MOS transistor 128 and the P channel MOS transistor 130 are connected with each other and the output potential Vout is outputted from a connection node therebetween. Further, a current flowing out from the connection node to a load circuit is indicated as Iout.

Below, description will be given of operation of the voltage amplifier circuit 50. The reference potential Vref is obtained by subjecting the boosted potential VPP to voltage division over resistors 108 and 110. By doing so, when the charge pump circuit is started up, in other words, when the boosted potential VPP is not sufficiently high, the reference potential Vref is also low and a bias current Ibias flowing in the N channel MOS transistor 116 decreases. With such an operation, a current load in the boosted potential VPP is reduced when the charge pump is started up and further, control is performed such that when the charge pump circuit has been started up sufficiently, the bias current Ibias takes a proper value.

When the N channel MOS transistor 116 operates in a saturation region, the bias current Ibias is at a constant value regardless of a value of the boosted potential VPP. Therefore, a potential difference between the bias voltage BIASP being the gate potential of the P channel MOS transistor 112 and the boosted potential VPP is a constant value independently of a change in the boosted potential VPP. Since the P channel MOS transistor 114 receiving the bias voltage BIASP at the gate thereof is designed to be equal to the P channel MOS transistor 112 in transistor size, a saturation current is the bias current Ibias. The bias current Ibias is forced to flow in the N channel MOS transistor 118 in diode connection and thereby, the bias voltage BIASN shows a constant value. The term "transistor size" used in this specification indicates a value of W/L', wherein W denotes a gate width and L' denotes an effective gate length.

That is, the bias voltage generation circuit 102 keeps |VPP−BIASP| and the bias voltage BIASN at constant values according to the reference potential Vref.

The bias voltage generation circuit 102 has a characteristic that as the reference potential Vref is higher, |VPP−BIASP| and BIASN are larger.

The bias voltages BIASP and BIASN generated in the bias voltage generation circuit 102 are supplied to the standard potential input portion 104. A transistor size of the P channel MOS transistor 120 is formed to be equal to that of the P channel MOS transistor 112 and thereby, a saturation current flowing in the P channel MOS transistor 120 is equal to the bias current Ibias. Furthermore, a transistor size of the N channel MOS transistor 126 is formed to be equal to that of the N channel MOS transistor 118 and thereby, a saturation current of the N channel MOS transistor 126 is equal to the bias current Ibias. Saturation currents of the P channel MOS transistor 120 and the N channel MOS transistor 126 are adjusted to be both equal to the bias current Ibias and thereby, a current flowing in the standard potential input portion 104 is equal to the bias current Ibias. The N channel MOS transistor 122 in diode connection and the P channel MOS channel transistor 124 are inserted serially between the P channel MOS transistor 120 and the N channel MOS transistor 126. Since a current flowing in the standard potential input portion 104 is the bias current Ibias and of a constant value, a potential difference between the node ND1a and the standard potential VIN is constant and similar to this, a potential difference between the node ND1b and the standard potential VIN is also constant.

A transistor size of the N channel MOS transistor 128 receiving the node ND1a of the standard potential input portion at the gate thereof is equal to that of the N channel MOS transistor 122 and further, a transistor size of the P channel MOS transistor 130 whose gate is connected to the node ND1b is equal to that of the P channel MOS transistor 124.

Next, description will be given of an output potential with respect to the N channel MOS transistors 122 and 128.

Figure 7:
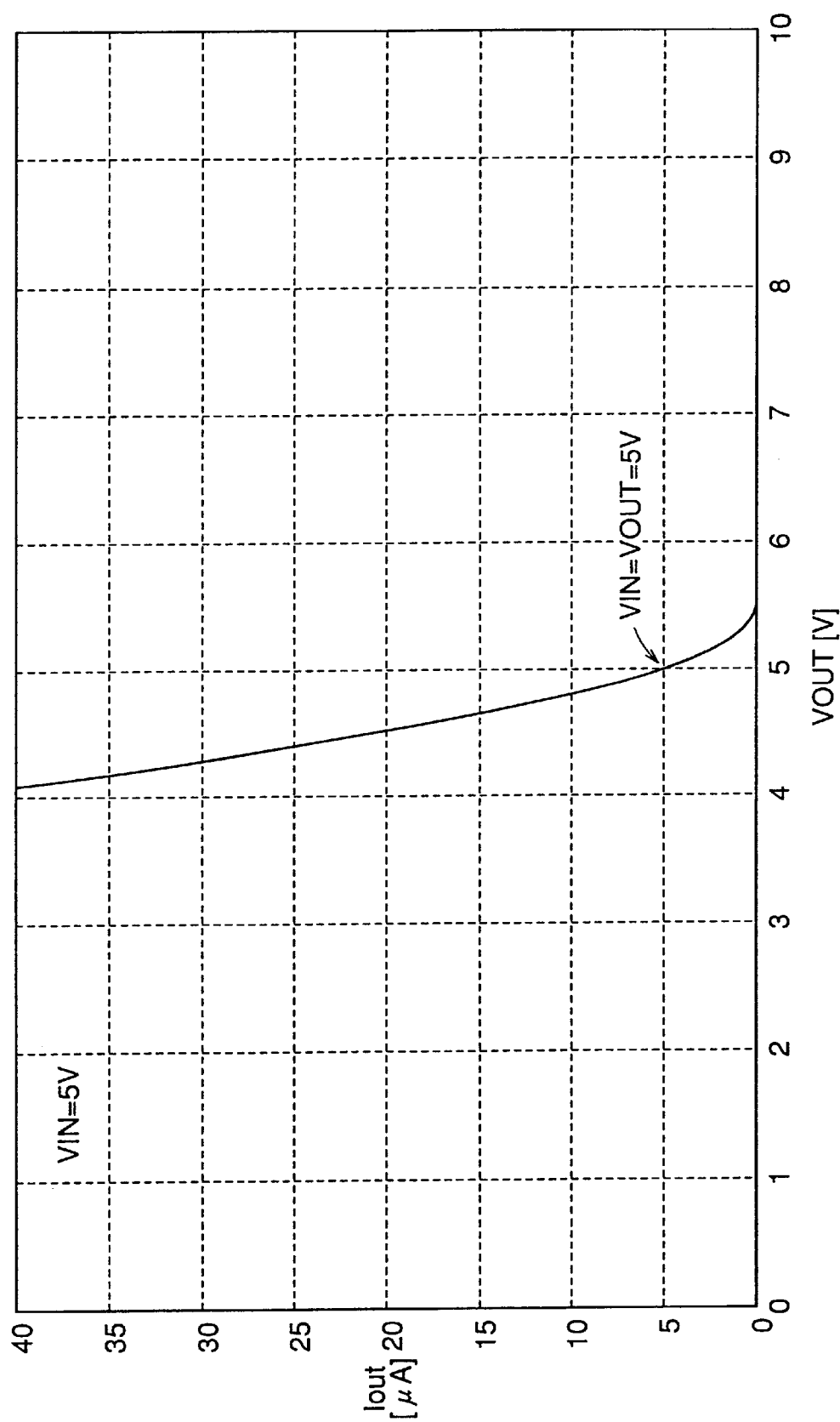
FIG. 7 is graph showing a relation between a current Iout flowing in an N channel MOS transistor 128 and the output potential VOUT.

FIG. 7 is graph showing a relation between a current Iout flowing in an N channel MOS transistor 128 and the output potential VOUT.

Referring to FIGS. 6 and 7, for example, when a bias current Ibias is 5 $\mu$A, a threshold voltage of the N channel MOS transistor 122 is 0.8 V and k is 20 $\mu$A/V$^2$ and these are substituted into the following formula:

$$I_{DS}=k(V_{GS}-Vth)^2 \tag{1}$$

wherein k indicates 1/2 $\mu$CoxW/L', $\mu$a mobility of a carrier, Cox a gate oxide film capacitance, W a gate width and L' an effective gate length. The formula (2) is obtained:

$$5[\mu A]=20[\mu A/V^2]\times(V_{GS}-0.8[V])^2 \tag{2}$$

The $V_{GS}$ is obtained 1.3 V from the formula (2). A potential at the node ND1a is 6.3 V when the standard potential VIN is 5 V and a relation between the output current Iout and the output potential VOUT is as shown in FIG. 7. According to FIG. 7, when the output potential VOUT is equal to the standard potential VIN, the output current Iout is 5 $\mu$A.

Next, a case will be described where the output potential VOUT is lower than the standard potential VIN. In that case, a further more current flows in the N channel MOS transistor 128. On the other hand, when the output potential VOUT is higher than the standard potential VIN, a current decreases and no drive capability is available in the N channel MOS transistor 128. That is, in a configuration in which only the N channel MOS transistor 128 is connected to the output node, the output node alone can be driven when the output node is lower than the standard potential VIN.

Therefore, in the configuration shown in FIG. 6, in order to supplement the functions of the N channel MOS transistors 122 and 128, the P channel MOS transistors 124 and 130 are added so as to constitute a circuit in symmetrical configuration and thereby, the output node can be driven even when the output is higher than the standard potential VIN.

With such a configuration adopted, when the output potential VOUT is higher than the standard potential VIN, the output potential is driven so as to decrease by the P channel MOS transistor 130. While on the other hand, when the output potential VOUT is lower than the standard potential VIN, the output potential VOUT is driven high by the N channel MOS transistor 128. In such a way, a wider dynamic range can be realized by the combination of the P channel MOS transistor and the N channel MOS transistor. A case in which two pairs of amplifiers are connected in a laterally symmetrical manner is called a push-pull configuration.

Figure 8:
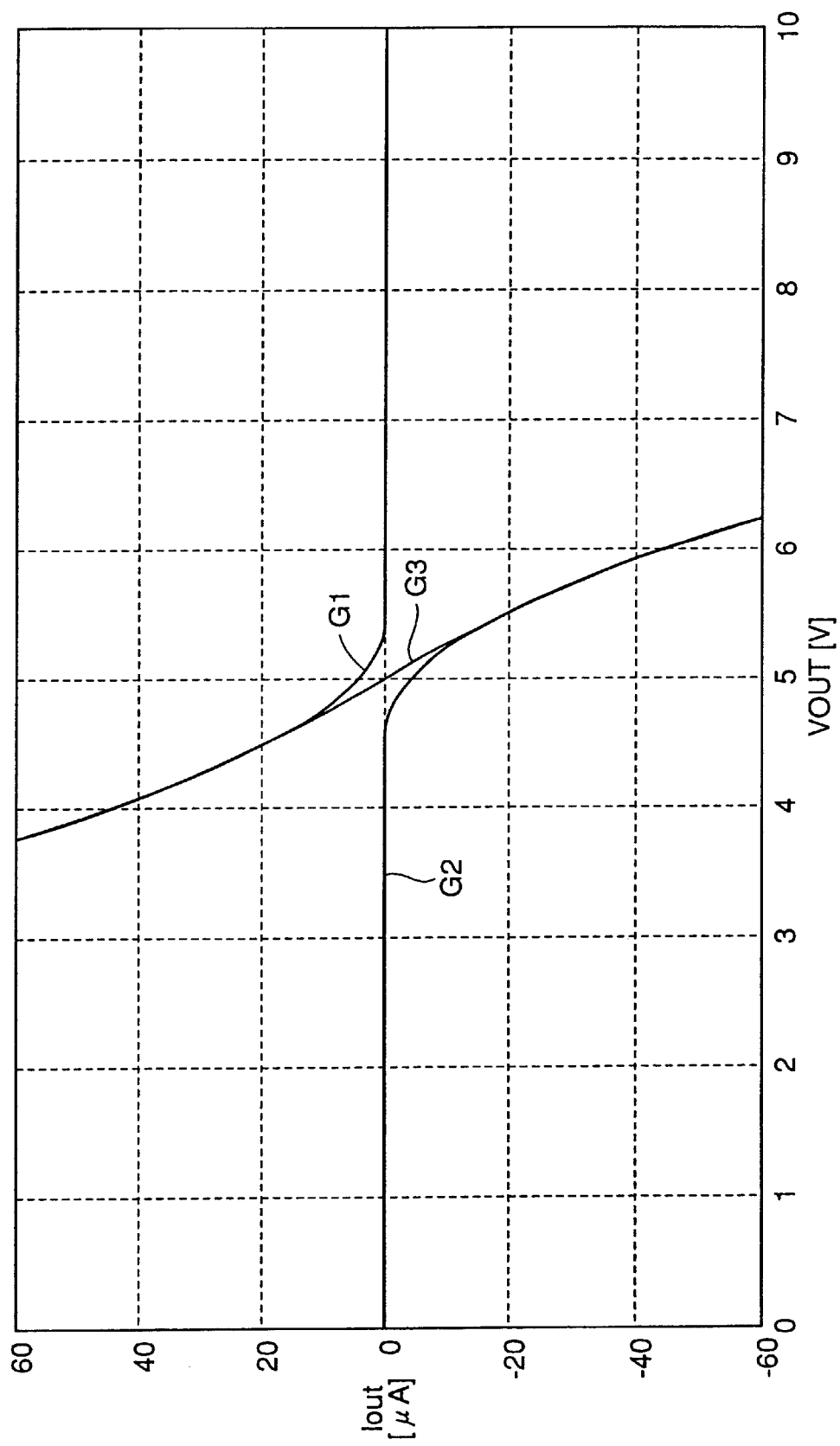
FIG. 8 is a graph showing a characteristic of a push-pull amplifier circuit.

FIG. 8 is a graph showing a characteristic of a push-pull amplifier circuit.

Referring to FIGS. 6 and 8, a curve G1 indicates a relation of a current flowing in the N channel MOS transistor 128 and the output potential VOUT. On the other hand, a curve G2 shows a relation of a current flowing in the P channel MOS transistor 130 and the output potential VOUT. The output current Iout flowing out from the output node is expressed by a difference between currents flowing in the N channel MOS transistor 128 and the P channel MOS transistor. It should be appreciated that in FIG. 8, curves show current values when the standard potential VIN is 5 V, and when the output potential VOUT is a potential equal to the standard potential VIN, currents flowing in the N channel MOS transistor 128 and the P channel MOS transistor 130 are canceled out by each other, wherein actually the output potential VOUT is 5 V, the output current Iout is 0 $\mu A$.

At this time, a current flowing from a node provided with the boosted potential VPP to a ground node, that is a direct current of the drive portion 106 is 5 $\mu A$.

It should be appreciated that in FIG. 8, threshold voltages of the P channel MOS transistors 124 and 130 are –0.8 V and k is 20 $\mu A/V^2$.

As described above, in a high voltage generation circuit shown in first embodiment, a configuration is adopted in which an output potential is driven so as to be equal to the standard potential VIN supplied based on the boosted potential VPP generated in the charge pump circuit according to a control signal, and therefore, the output potential can switched over at a high speed. Further, a push-pull configuration is adopted and in any of cases where the output potential decreases or increases according to a load, the output potential can be match with the standard potential quickly.

Modification of First Embodiment

Figure 9:
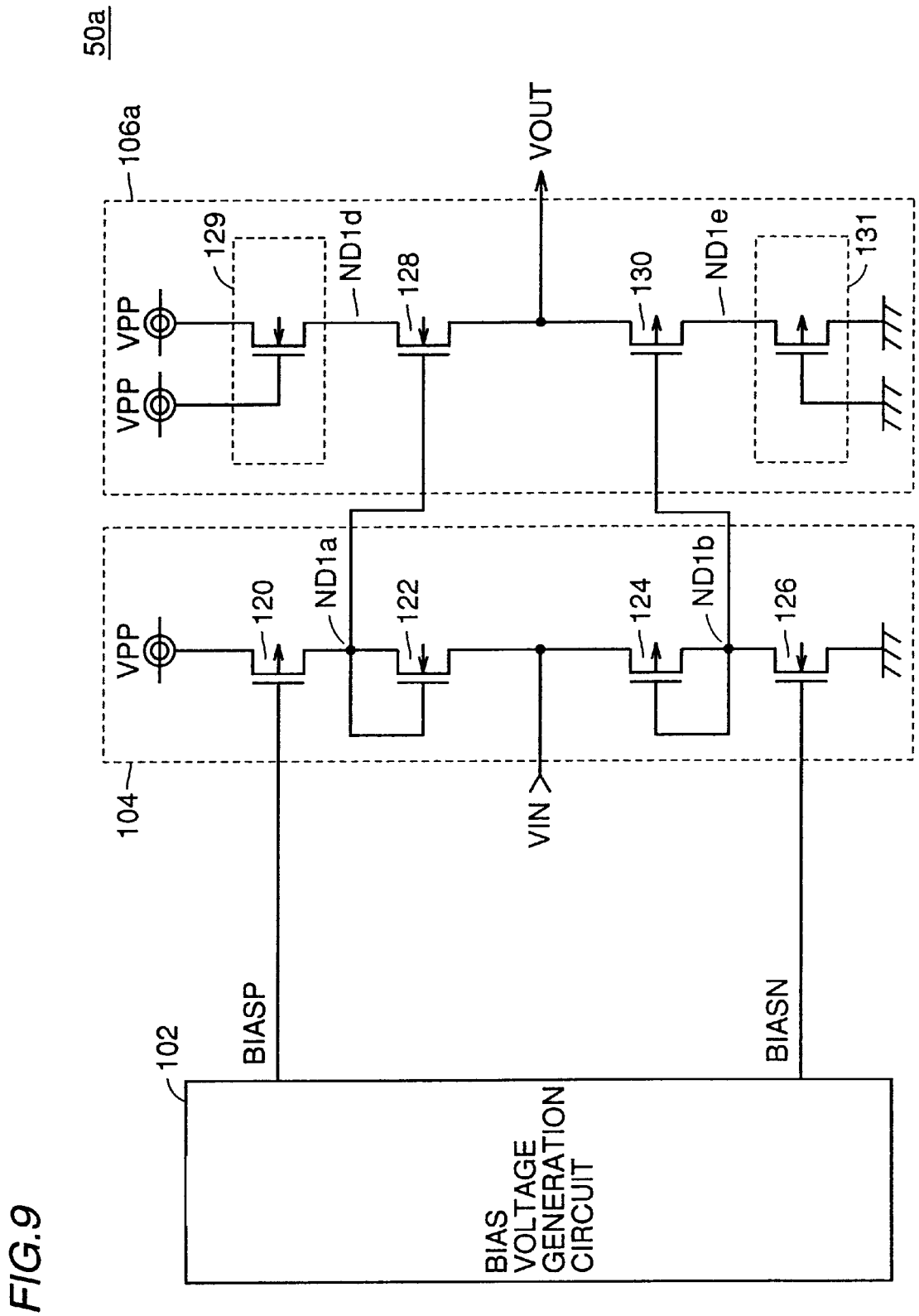
FIG. 9 is a circuit diagram representing a configuration of a voltage amplifier circuit 50a used in a modification of first embodiment.

FIG. 9 is a circuit diagram representing a configuration of a voltage amplifier circuit 50a used in a modification of first embodiment.

Referring to FIG. 9, a voltage amplifier 50a has a configuration obtained by incorporating a drive portion 106a instead of the drive portion 106 in the configuration of the voltage amplifier circuit 50 shown in FIG. 6. The other part of the configuration is similar to the corresponding part of the voltage amplifier circuit 50 shown in FIG. 6 and the description thereof is not repeated.

A drive portion 106a is configured such that the configuration of the drive portion 106 shown in FIG. 6 further includes: an N channel MOS transistor 129 that is connected between the drain of the N channel MOS transistor 128 and a node provided with the boosted potential VPP, and which is supplied with the boosted potential VPP at the gate thereof; and a P channel MOS transistor 131 that is connected between the drain of the P channel MOS transistor 130 and the ground node, and whose gate is connected to the ground node.

In a circuit that receives the boosted potential VPP to operate, when a high voltage is applied to between the source and drain of a transistor, an electric field in the vicinity of the drain is high and carriers in the channel are accelerated under the high electric field for each to gain large energy. Since the carriers have very high energy, the carriers are called hot carriers. When the hot carriers are trapped in an oxide film, a change in threshold voltage occurs, thereby, causing a phenomenon to degrade transistor characteristics.

In the drive portion 106a, an N channel MOS transistor 129 in the conductive state is provided as alleviation means for alleviating a high voltage imposed on the N channel MOS transistor 128 when the output potential VOUT is low.

Similar to this, a P channel MOS transistor 131 in the conductive state is provided as alleviation means for alleviating a high voltage imposed on the P channel MOS transistor 130, when the output potential VOUT is high.

Figure 10:
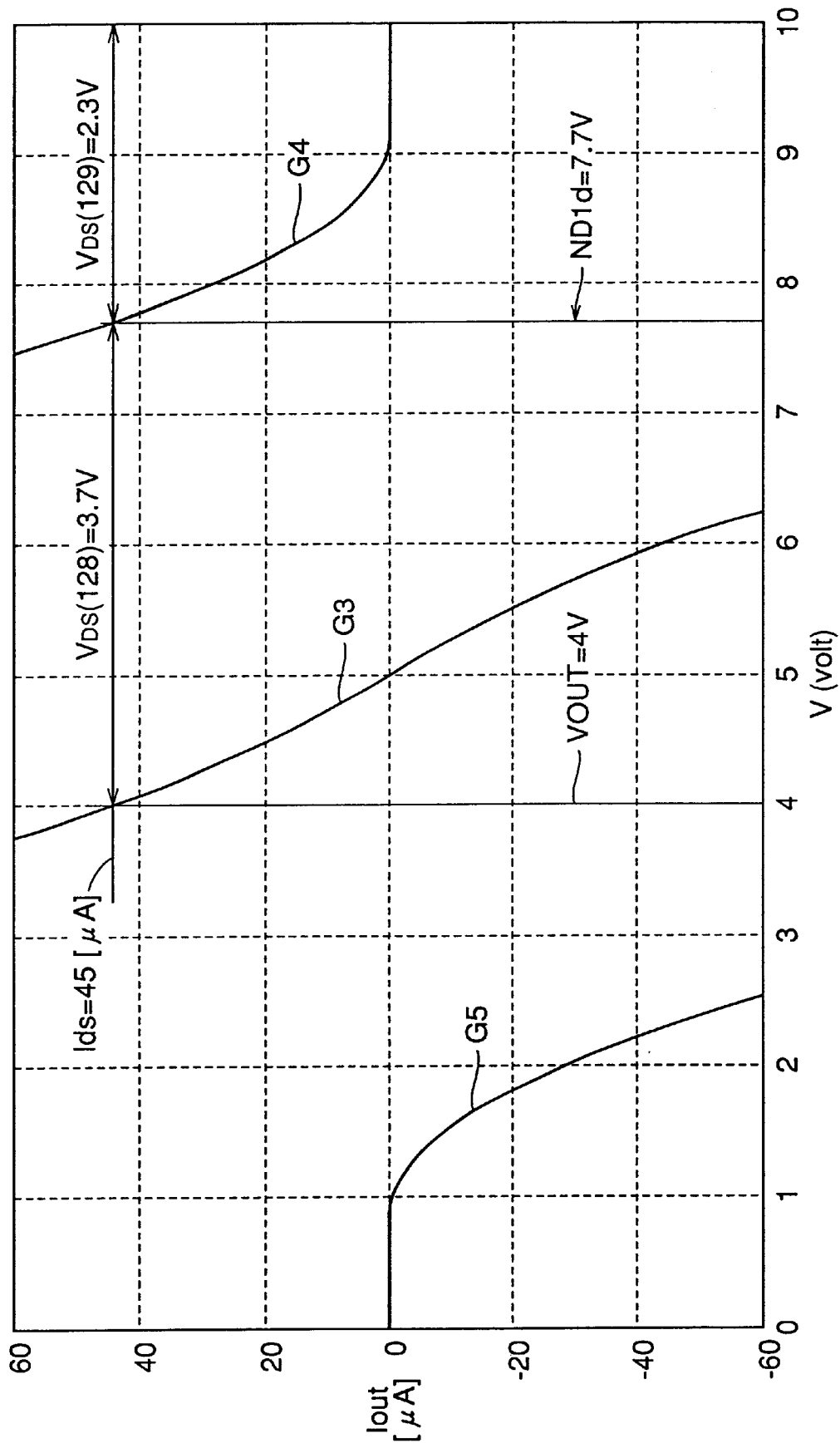
FIG. 10 is a graph for describing operation of the circuit shown in FIG. 9.

FIG. 10 is a graph for describing operation of the circuit shown in FIG. 9.

Referring to FIGS. 9 and 10, when the standard potential VIN is 5 V and the output potential VOUT is 4 V, then a voltage between the gate and source of the N channel MOS transistor 128 is 6.3–4=2.3 V since a voltage between the gate and source of the N channel MOS transistor 122 is 1.3 V, as described above, and therefore, the potential at the node ND1a is 6.3 V. Hence, a current flowing in the N channel MOS transistor 128 is obtained as follows:

$$Ids=20[\mu A/V^2]\times(2.3[V]-0.8[V])^2=45[\mu A]$$

This current also flows in the N channel MOS transistor 129. Since the N channel MOS transistors 128 and 129 are equal to each other in transistor size, a voltage between the gate and source of the N channel MOS transistor 129 is also 2.3 V and a potential at the node ND1d is 7.7 V.

To describe with reference to the graph, a curve G3 is one showing the output current Iout determined by the N channel MOS transistor 128 and the P channel MOS transistor 130, both described in FIG. 8. A curve G4 is one showing a relation between a current flowing in the N channel MOS transistor 129 and a voltage at the node ND1a. Likewise, a curve G5 is one showing a relation between a potential at the node ND1a and a current flowing in the P channel MOS transistor 131.

In FIG. 10, when the output potential VOUT is 4 V, as can be seen from the graph, a current Ids of 45 $\mu A$ is found as a reading on the ordinate at a intersection of the curve G3 and a straight line perpendicular to the abscissa passing through the calibration marking of 4 V thereon. It is found that since an equal current flows in the N channel MOS transistor 129, as shown in the graph, a voltage $V_{DS}$ (128) between the drain and source of the N channel MOS transistor 128 is 3.7 V and further a voltage $V_{DS}$ (129) between the drain and source of the N channel MOS transistor 129 is 2.3 V.

In the circuit configuration shown in FIG. 6, when the output potential VOUT=4 V, a voltage between the drain and source of the N channel MOS transistor 128 is 6 V, whereas by inserting voltage alleviating means, as shown in FIG. 9, the voltage between the drain and source can be reduced down to 3.7 V.

Likewise, when the output potential VOUT is higher than 5 V, voltages imposed on the P channel MOS transistors 130 and 131 can be obtained by calculating relations of the curves G3 and G5 in a similar way. With the P channel MOS transistor 131 provided, a voltage between the drain and source of the N channel MOS transistor 130 can be reduced as well.

As described above, in first modification of first embodiment, degradation by hot carriers of a transistor at the output stage can be prevented from occurring in an amplifier circuit handling a boosted potential.

Second Embodiment

In second embodiment, description will be given of a voltage amplifier circuit in which the dynamic range for high voltage amplification shown in first embodiment is improved.

Figure 11:
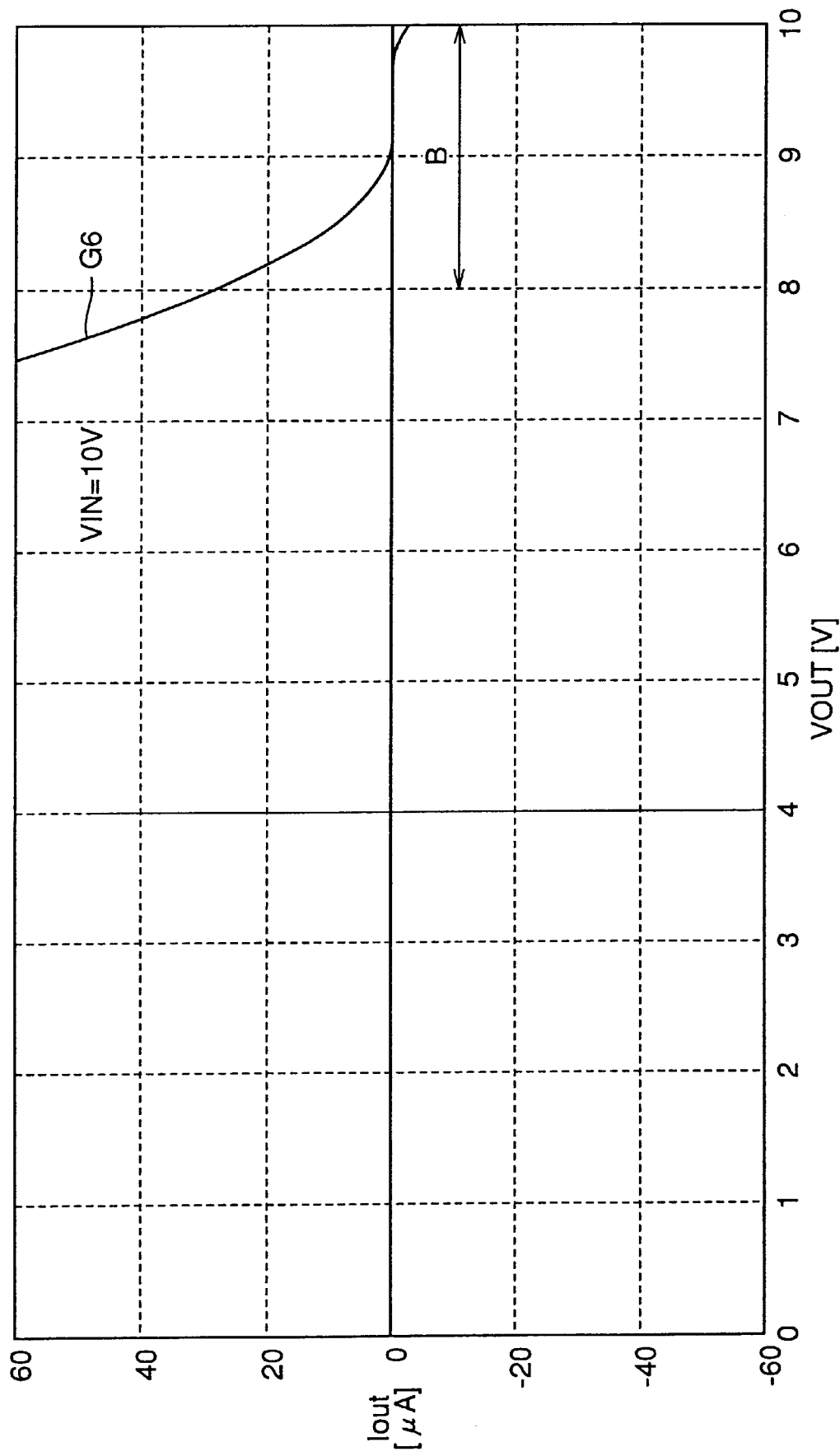
FIG. 11 is a graph showing a relation between the output potential VOUT and the output current Iout when 10V as a standard potential VIN is applied on the voltage amplifier circuit shown in FIG. 6.

FIG. 11 is a graph showing a relation between the output potential VOUT and the output current Iout when 10 V as a standard potential VIN is applied on the voltage amplifier circuit shown in FIG. 6.

Figure 12:
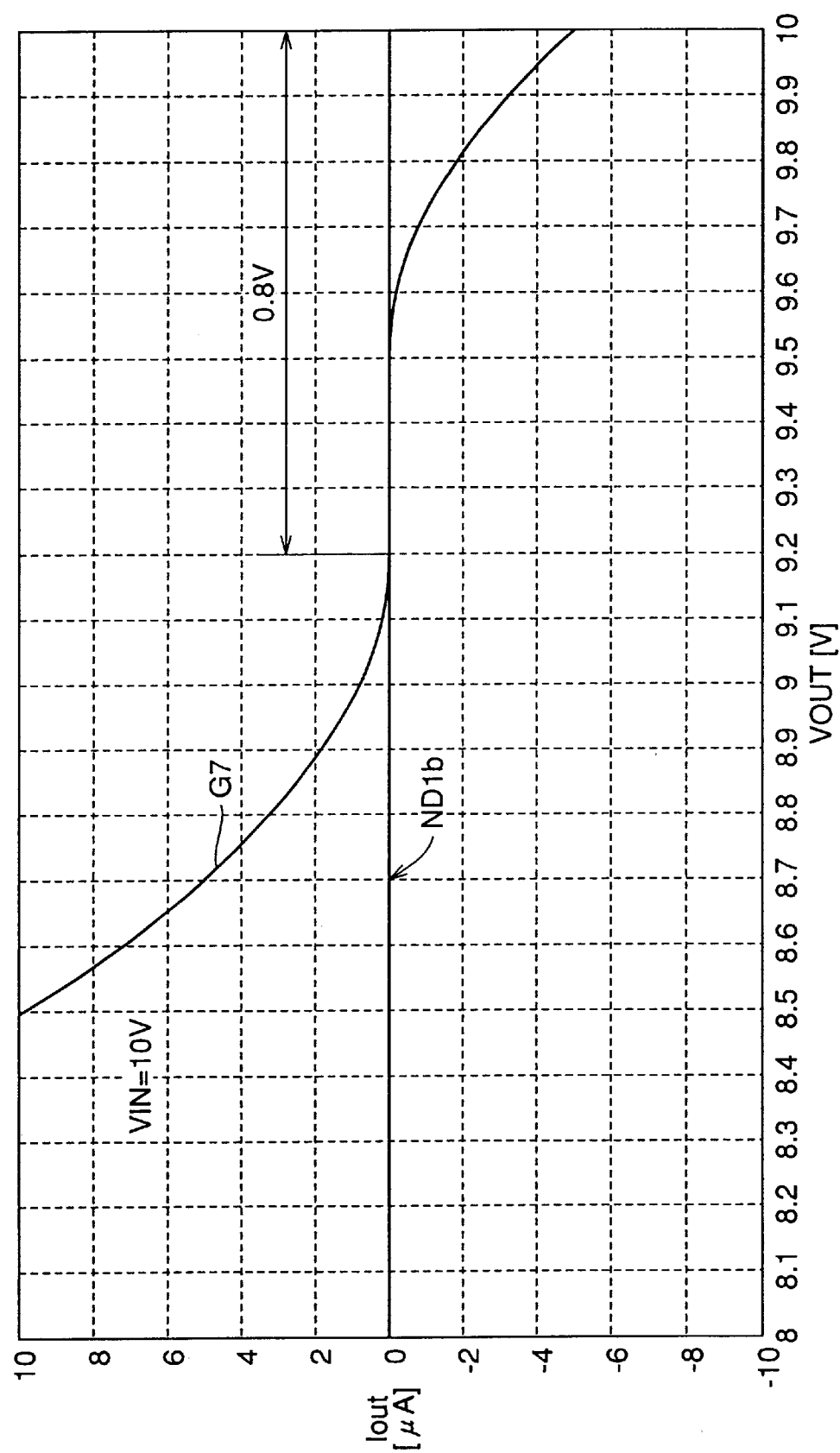
FIG. 12 is an enlarged graph showing B portion of the curve G6 of FIG. 11.

FIG. 12 is an enlarged graph showing B portion of the curve G6 of FIG. 11.

Referring to FIGS. 6 and 12, when 10 V is supplied as the standard potential VIN, currents flowing the P channel MOS transistor 120 and the N channel MOS transistor 122 are both zero. Further, a potential at the node ND1a is 10 V, which is equal to the boosted potential VPP.

On the other hand, a current of 5 $\mu$A, equal to Ibias, still flows in the N channel MOS transistor 126 and the current also flows in the P channel MOS transistor 124. Therefore, a potential at the node ND1b is 8.7 V, lower than the standard potential VIN by 1.3 V. As can be seen from a curve G7 of FIG. 12, when the output potential VOUT is lower than 9.2 V, the N channel MOS transistor 128 is conductive and a current flows so as to raise the output potential VOUT. On the other hand, when the output potential VOUT is 9.5 V or higher, the P channel MOS transistor 130 is conductive and thereby, a current flows so as to reduce the output potential VOUT.

Therefore, in the circuit shown in FIG. 6, in a case where, although the standard potential VIN is 10 V, the output potential VOUT is in the range from 9.2 to 9.4 V, the output node is not driven. That is, when the standard potential VIN is 10 V, the output potential is settled in the range from 9.2 to 9.4 V. In other word, a high voltage cannot be outputted with sufficient amplification.

Likewise, when 0 V is inputted as the standard potential VIN, a potential slightly higher than 0 V is outputted as the output potential VOUT.

That is, in the configuration of the voltage amplifier circuit 50 shown in FIG. 6, calculations on the P channel MOS transistor 124 and the N channel MOS transistor 124 shows that the N channel MOS transistor 130 cannot be driven, except when the standard potential VIN is 1.8 V or higher. In other words, in a case of the boosted potential VPP is 10 V, a limitation on the dynamic range of the standard potential is 1.8 V<VIN<8.2 V.

Figure 13:
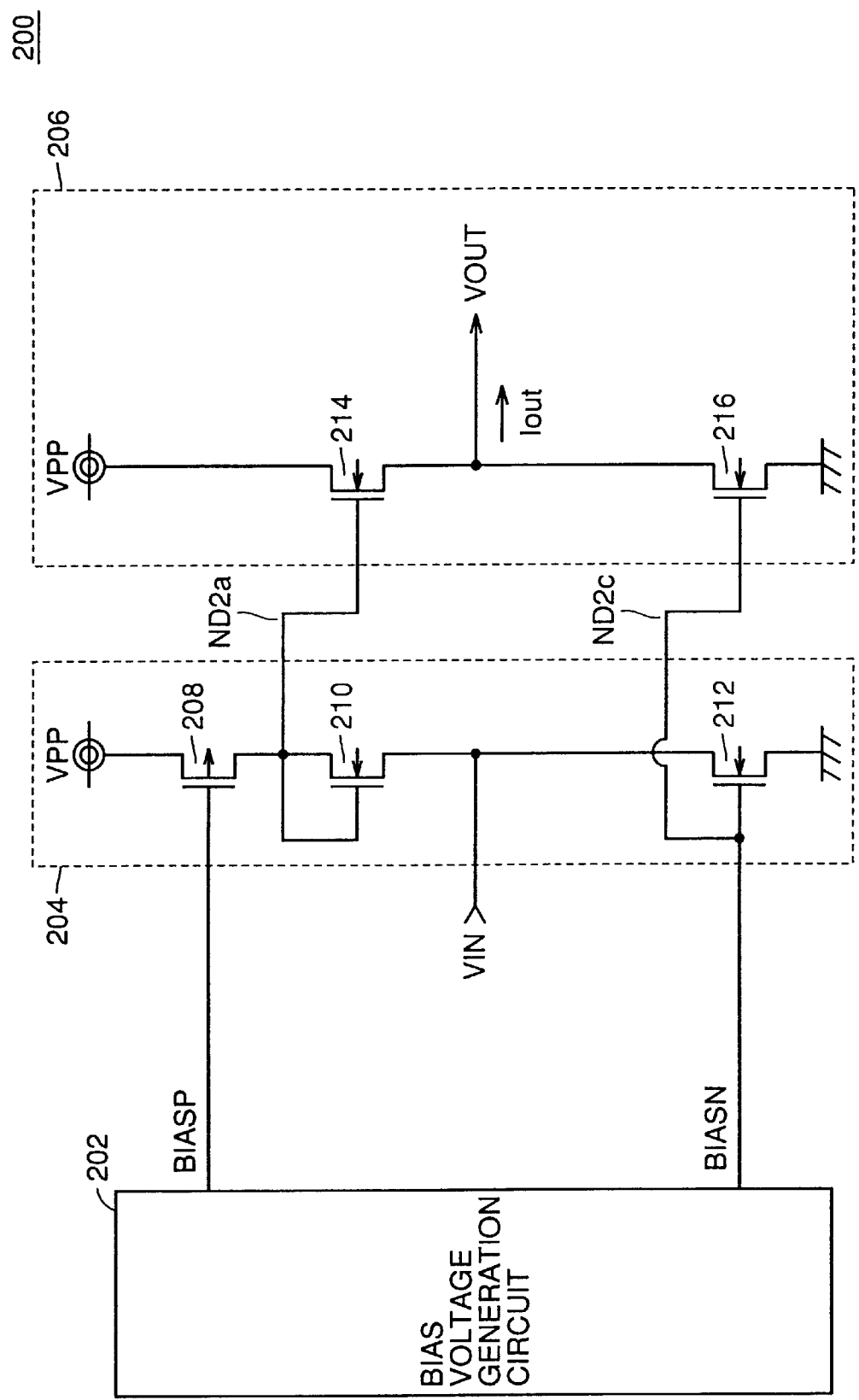
FIG. 13 is a circuit diagram representing a configuration of a voltage amplifier circuit 200 used in second embodiment.

FIG. 13 is a circuit diagram representing a configuration of a voltage amplifier circuit 200 used in second embodiment.

Referring to FIG. 13, a voltage amplifier circuit 200 includes: a bias voltage generation circuit 202 outputting the bias voltages BIASP and BIASN; a standard potential input portion 204 receiving the standard potential VIN; and a drive portion 206 receiving an output of the standard potential input portion 204 to output the output potential VOUT.

The bias voltage generation circuit 202 has a configuration similar to the bias voltage generation circuit 102 shown in FIG. 6 and therefore, the description thereof is not repeated.

The standard potential input portion 204 includes: a P channel MOS transistor 208, connected between a node provided with the boosted potential VPP and a node ND2a, and receiving the bias voltage BIASP at the gate thereof; an N channel MOS transistor 210, whose drain and gate are connected to the node ND2a, and which receives the standard potential VIN at the source thereof; and a N channel MOS transistor 212 that receives the standard potential VIN at the drain thereof, whose source is connected to a ground node, and whose gate is connected to a node ND2c. The bias voltage BIASN is supplied to the ND2c.

The drive portion 206 includes: an N channel MOS transistor 214, whose drain is connected to the boosted potential VPP, and whose gate is connected to the node ND2a; and an N channel MOS transistor 216 that is connected between the source of the N channel MOS transistor 214 and a ground node, and whose gate is connected to a node ND2c. The output potential Vout is outputted from the drain of the N channel MOS transistor 216.

Next, description will be given of operation of the voltage amplifier circuit 200 shown in FIG. 13. The P channel MOS transistor 208, the N channel MOS transistor 210 and the N channel MOS transistor 212 included in the standard potential input portion 204 perform functions corresponding to the P channel MOS transistor 120, the N channel MOS transistor 122 and the N channel MOS transistor 126, respectively, shown in FIG. 6. When the parameters are set such that a current Ibias flowing into the standard potential input portion 204 is 5 $\mu$A, a threshold voltage of the N channel MOS transistor 210 is 0.8 V, k is 20 $\mu$A/V$^2$ and the standard potential VIN is 5 V, then a potential of the node ND2a is 6.3 V.

Next, a case is considered where a transistor size of the N channel MOS transistor 214 is $\alpha$ times that of the N channel MOS transistor 210 and $\alpha$ is set to 10. k of the N channel MOS transistor 214 is 200 $\mu$A/V$^2$.

Figure 14:
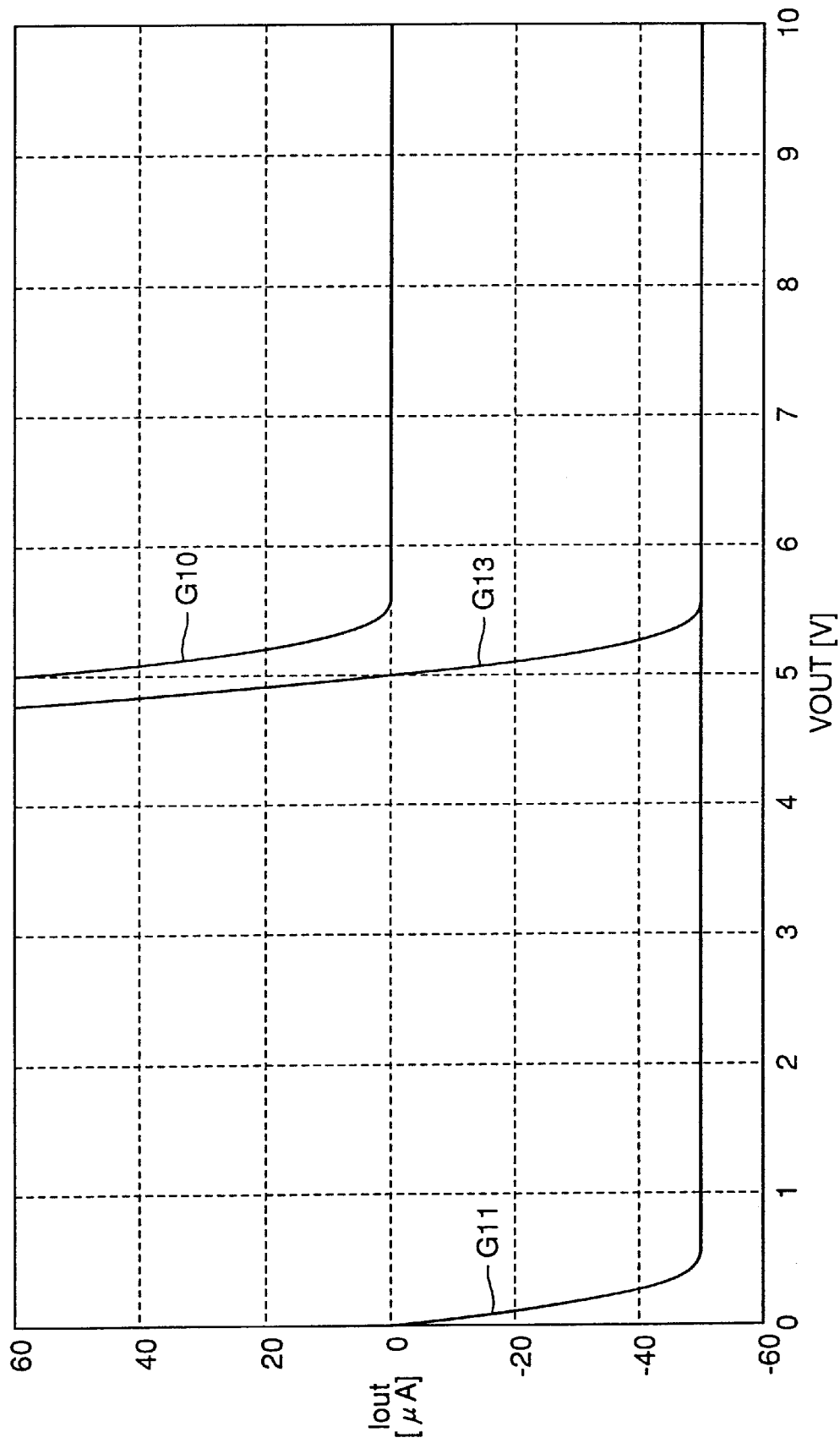
FIG. 14 is a graph for describing a current flowing in the N channel MOS transistor 214 of FIG. 13.

FIG. 14 is a graph for describing a current flowing in the N channel MOS transistor 214 of FIG. 13.

Referring to FIGS. 13 and 14, a case is considered where 5 V is applied as the standard potential VIN. A curve G10 shows a relation between a current flowing in the N channel MOS transistor 214 and the output potential VOUT. When the output potential VOUT is equal to the standard potential VIN, a current flowing in the N channel MOS transistor 214 is 50 $\mu$A, which is $\alpha$0 times (ten times) the bias current Ibias.

On the other hand, when a transistor size of the N channel MOS transistor 216 is $\alpha$ times that of the N channel MOS transistor 212, a saturation current of the N channel MOS transistor 216 is also 50 $\mu$A, which is $\alpha$ times (ten times) the bias current Ibias. A curve G11 shows a relation between the output potential VOUT and a current flowing in the N channel MOS transistor 216. A differential between a current flowing in the N channel MOS transistor 214 and a current flowing in the N channel MOS transistor 216 is the output current Iout. The output current Iout is shown as a curve G13.

In the configuration shown in FIG. 13, even when the standard potential VIN decreases, the bias current flowing in the N channel MOS transistor 212 does not decrease and therefore, the lower limit of the dynamic range is reduced down to 0 V.

For example, when the standard potential VIN is 0 V, a voltage between the source and drain of the N channel MOS transistor 212 is 0 V. Accordingly, no current flows in the N channel MOS transistor 212. As described in first embodiment, however, 5 $\mu$A flows in the P channel MOS transistor 208. This current further flows into a node to which the standard potential VIN is transmitted. In this case, since 5 μA still flows in the N channel MOS transistor 210, the node ND2a is held at a voltage higher than the standard potential VIN by 1.3 V even when the standard potential VIN is 0 V.

Therefore, the circuit of FIG. 13 has a dynamic range of the standard potential VIN of 0 V<VIN<8.2 V when the boosted potential VPP is 10 V. That is, the dynamic range is advantageously broadened compared with the circuit shown in FIG. 6.

First Modification of Second Embodiment

Figure 15:
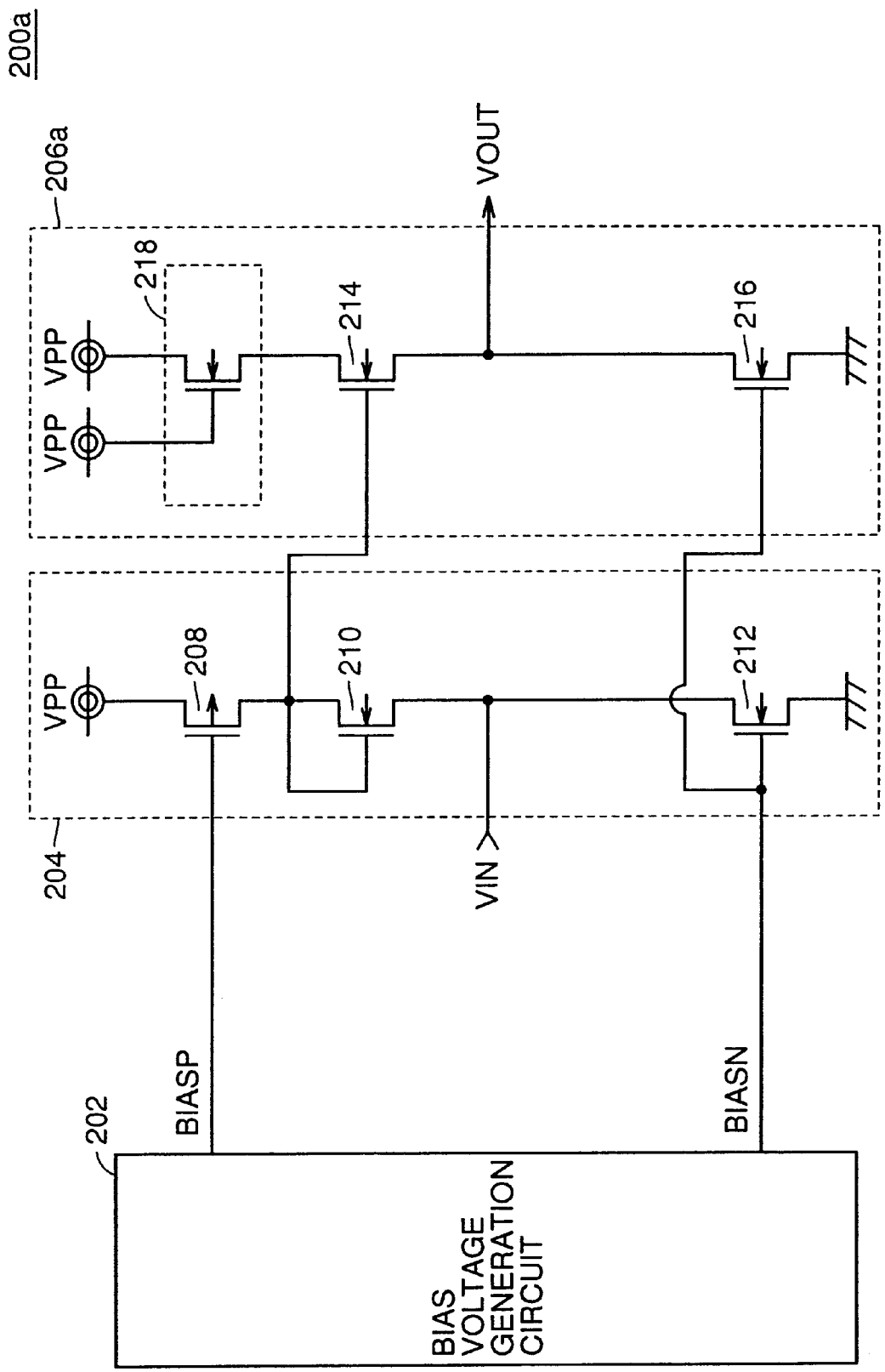
FIG. 15 is a circuit diagram representing a configuration of a voltage amplifier circuit 200a used in first modification of second embodiment.

FIG. 15 is a circuit diagram representing a configuration of a voltage amplifier circuit 200a used in first modification of second embodiment.

Referring to FIG. 15, a voltage amplifier circuit 200a is configured such that in the configuration of the voltage amplifier circuit 200 shown in FIG. 13, a drive portion 206a substitutes for the drive portion 206. The other part of the configuration is similar to the corresponding part of the voltage amplifier circuit 200 and the description thereof is not repeated.

The configuration of the drive portion 206a is the configuration of the drive portion 206 of FIG. 13 in which an N channel MOS transistor 218 is inserted between the drain of the N channel MOS transistor 214 and a node provided with the boosted potential VPP. The gate of the N channel MOS transistor 218 is coupled with the boosted potential VPP.

The N channel MOS transistor 218 is connected serially to the N channel MOS transistor 214 and thereby, a high voltage applied between the drain and source of the N channel MOS transistor 214 is alleviated, leading to reduction in degradation of the transistor caused by hot carriers.

Second Modification of Second Embodiment

In the voltage amplifier circuit 200 described in second embodiment, when 4 V is outputted as the output potential VOUT under conditions of the standard potential VIN is 5 V and a potential of the node ND2a is 6.3 V, a voltage VGS between the gate and source of the N channel MOS transistor 214 is 2.3 V. At this time, a current flowing in the N channel MOS transistor 214 is calculated as follows:

$$I_{DS} = 200\ \mu A/V^2 \times (2.3\ V - 0.8\ V)^2 = 450\ \mu A$$

An amount of 50 μA among the current flows in the N channel MOS transistor 216 and the residual amount of 400 μA is an output current $I_{OUT}$. The current of 450 μA flowing in the N channel MOS transistor 214 is supplied by a charge pump circuit generating the boosted potential VPP. In a case of a supply source having current supply capability being not high, such as the charge pump circuit, however, a problem arises in that a magnitude of the boosted potential VPP decreases.

Figure 16:
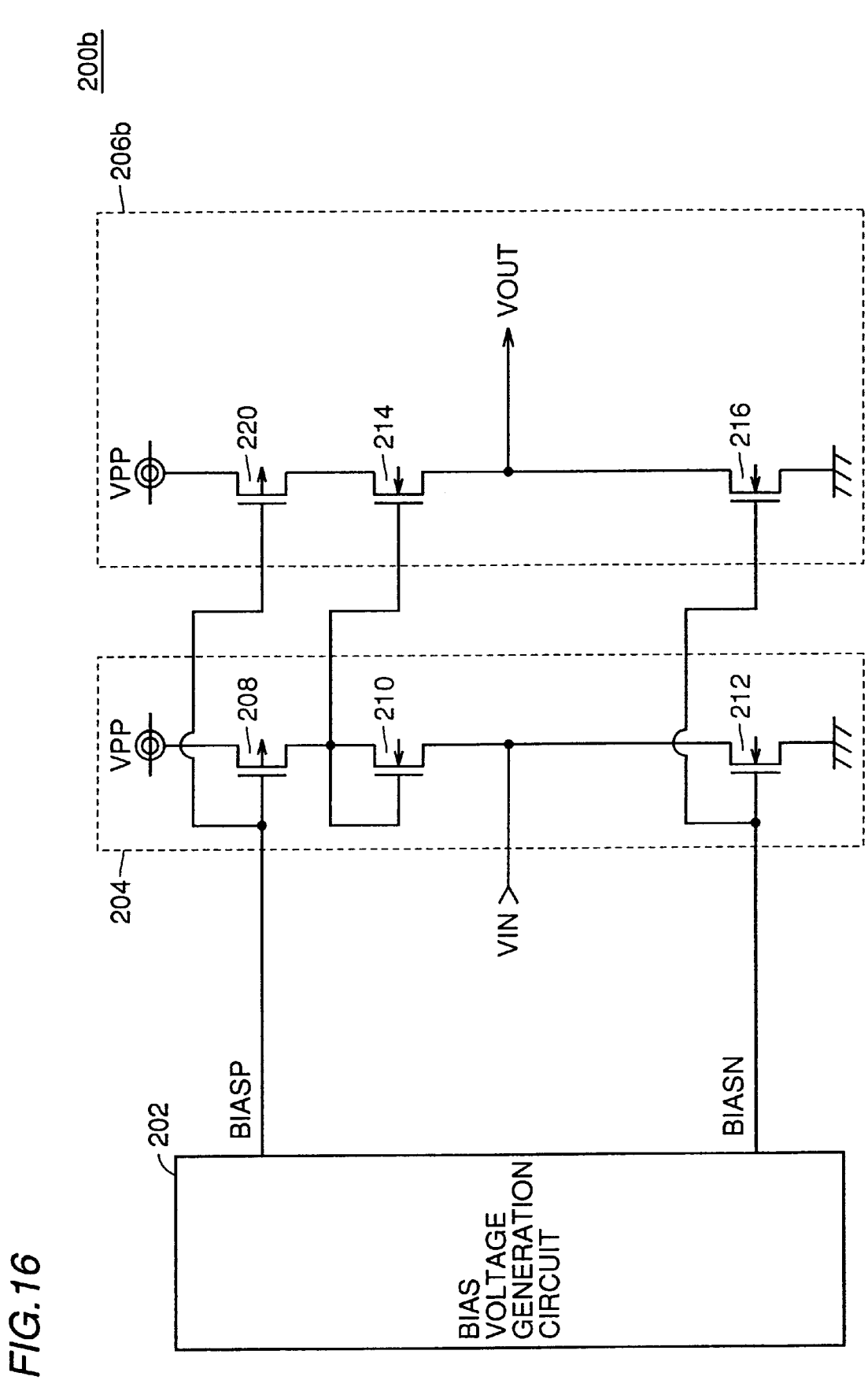
FIG. 16 is a circuit diagram representing a configuration of a voltage amplifier circuit 200b of second modification of second embodiment.

FIG. 16 is a circuit diagram representing a configuration of a voltage amplifier circuit 200b of second modification of second embodiment.

The voltage amplifier circuit 200b is configured such that in the configuration of the voltage amplifier circuit 200 shown in FIG. 13, a drive portion 206b substitutes for the drive portion 206. The other part of the configuration is similar to the corresponding part of the voltage amplifier circuit 200 and the description thereof is not repeated.

The configuration of the drive portion 206b is the configuration of the drive portion 206 of FIG. 13 in which a P channel MOS transistor 220 is inserted between a node provided with the boosted potential VPP and the drain of the N channel MOS transistor 214. The gate of the P channel MOS transistor 220 receives the bias voltage BIASP.

A transistor size of the P channel MOS transistor 220 is β times (for example 20 times) that of the P channel MOS transistor 208.

As described previously, since the bias current Ibias is 5 μA, a saturation current of the P channel MOS transistor 220 is 100 μA. Therefore, a current flowing out from a node provided with the boosted potential VPP through the P channel MOS transistor 220 is limited to 100 μA at most.

Figure 17:
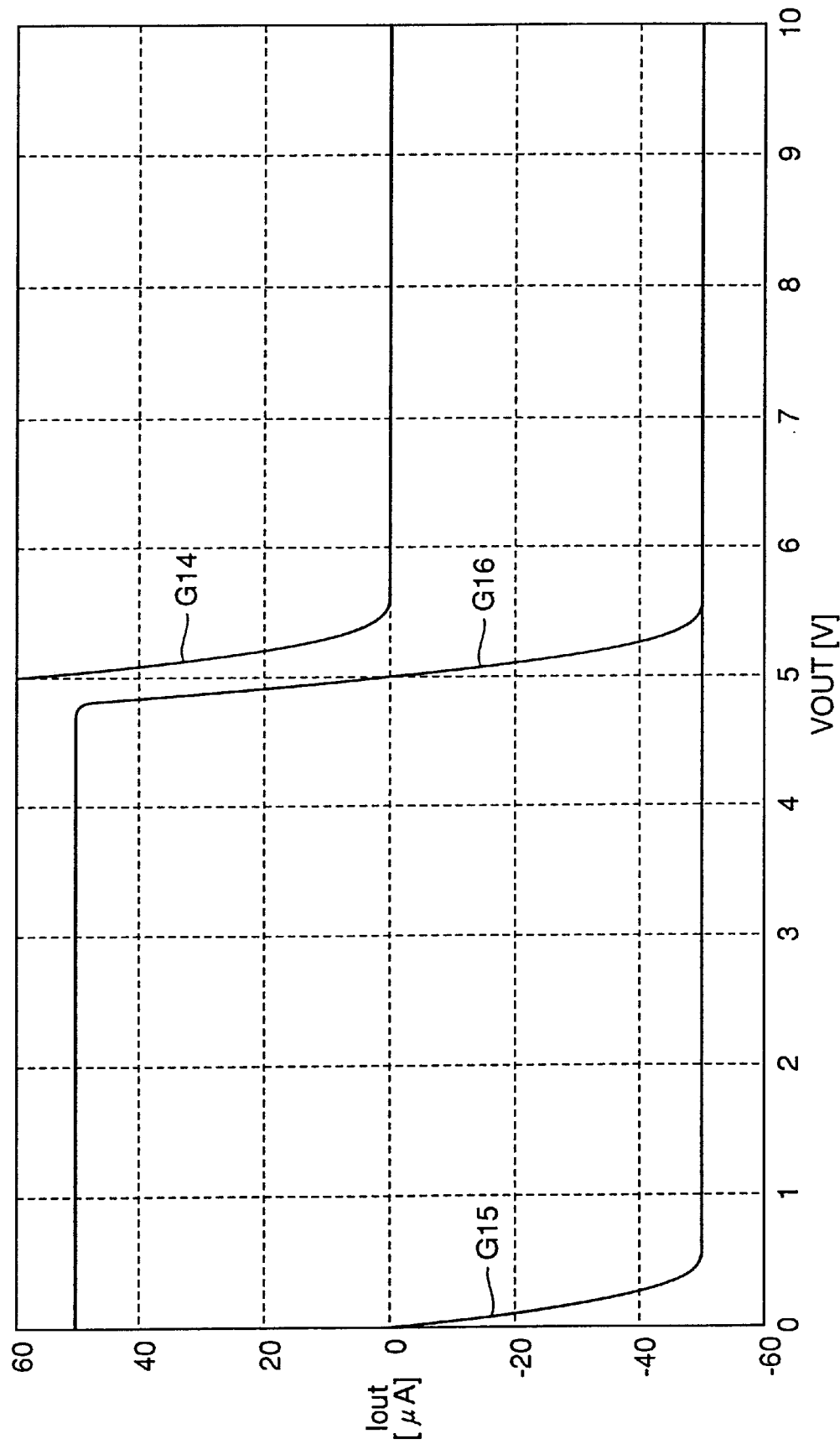
FIG. 17 is a graph for describing a characteristic of the voltage amplifier circuit 200b shown in FIG. 16.

FIG. 17 is a graph for describing a characteristic of the voltage amplifier circuit 200b shown in FIG. 16.

Referring to FIG. 17, a curve G14 shows a relation between a current flowing in the N channel MOS transistor 214 and the output potential VOUT when the standard potential VIN is 5 V in FIG. 13. However, a current is limited to the maximum 100 μA due to the limitation of the P channel MOS transistor 220.

A curve G15 shows a relation between a current flowing in the N channel MOS transistor 216 and the output potential VOUT of the circuit shown in FIG. 16.

A curve G16 shows a relation of the output potential VOUT and the output current Iout obtained by a differential between a current flowing in the N channel MOS transistor 214 and a current flowing in the N channel MOS transistor 216 when the standard potential VIN is 5 V.

According to the curve G16, even when the output potential VOUT is lower than 5 V, the output current Iout is held at 50 μA or lower. Therefore, by setting a coefficient β to be determined by a size of the P channel MOS transistor 220 according to a capability of a circuit generating the boosted potential VPP, a reduction in the boosted potential VPP can be prevented from occurring.

Third Modification of Second Embodiment

Figure 18:
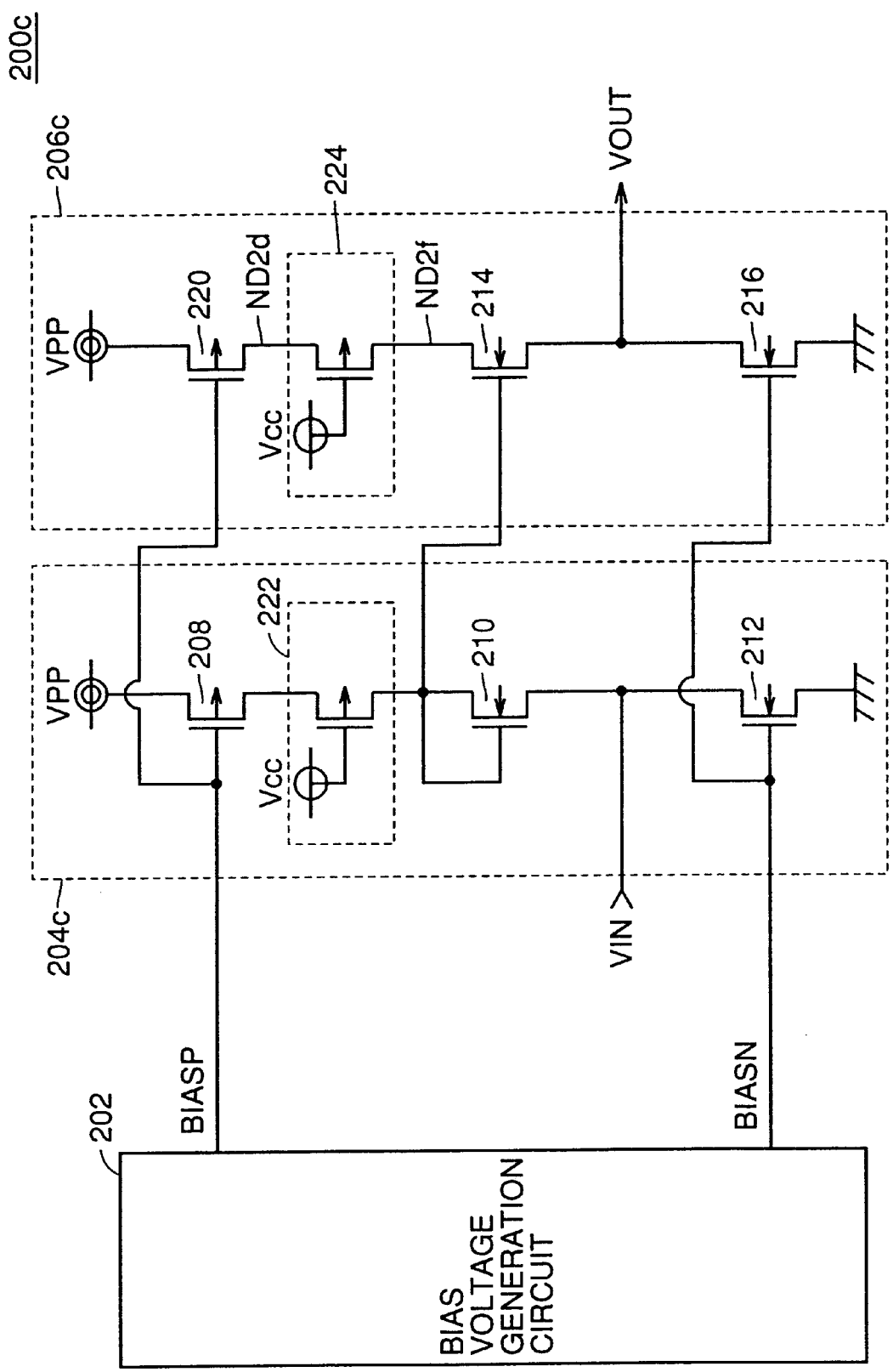
FIG. 18 is a circuit diagram representing a configuration of a voltage amplifier circuit 200c used in third modification of second embodiment.

FIG. 18 is a circuit diagram representing a configuration of a voltage amplifier circuit 200c used in third modification of second embodiment.

Referring to FIG. 18, a voltage amplifier circuit 200c is the same as the configuration of the voltage amplifier circuit 200b shown in FIG. 16 with the exception that the voltage amplifier circuit 200c is configured that in the configuration of the voltage amplifier circuit 200b shown in FIG. 16, a standard potential input portion 204c substitutes for the standard potential input portion 204 and a drive portion 206c substitutes for the drive portion 206b. The standard potential input portion 204c has the configuration of the standard potential input portion 204b in FIG. 16 in which a P channel MOS transistor 222 is inserted between the N channel MOS transistor 210 and the P channel MOS transistor 208. The gate of the P channel MOS transistor 222 is coupled with the power supply potential.

The drive portion 206c has the configuration of the drive portion 206b in FIG. 16 in which a P channel MOS transistor 224 is inserted between the P channel MOS transistor 220 and the N channel MOS transistor 214. The gate of the P channel MOS transistor 224 is coupled with the power supply potential.

The other part of the configuration is similar to the corresponding part of the voltage amplifier circuit 200b in FIG. 16 and the description thereof is omitted.

Herein, for example, a transistor size of the P channel MOS transistor 222 is equal to that of the P channel MOS transistor 208, and a transistor size of the P channel MOS transistor 224 is equal to that of the P channel MOS transistor 220.

As described in FIG. 16, only a current 100 μA as the maximum flows in the P channel MOS transistor 220. Accordingly, only the maximum 100 μA flows in the P channel MOS transistor 224 as well.

When a current is restricted by the P channel MOS transistor 220, not high voltage is imposed between the source and drain of the N channel MOS transistor 214 and a high voltage is imposed between the source and drain of the P channel MOS transistor 220.

As a countermeasure against this, the P channel MOS transistor 224 is incorporated into the drive portion 206c. Since transistor sizes of the P channel MOS transistors 220 and 224 are equal to each other, potential differences between the gates and sources of the respective transistors are equal to each other when equal currents flow therein. Since the gate of the P channel MOS transistor 224 is coupled to the power supply potential Vcc, a potential of the node ND2d is expressed as follows:

$$V(ND2d)=Vcc+|VPP-BIASP|$$

and does not decrease lower than this potential. That is, a voltage $V_{DS}$ between the source and drain of the P channel MOS transistor 220 can be restricted to be equal or lower than a value expressed by the following formula:

$$V_{DS}=VPP-(Vcc+|VPP-BIASP|)$$

and alleviation of a voltage imposed between the source and drain of the P channel MOS transistor 220 can be realized.

Third Embodiment

Figure 19:
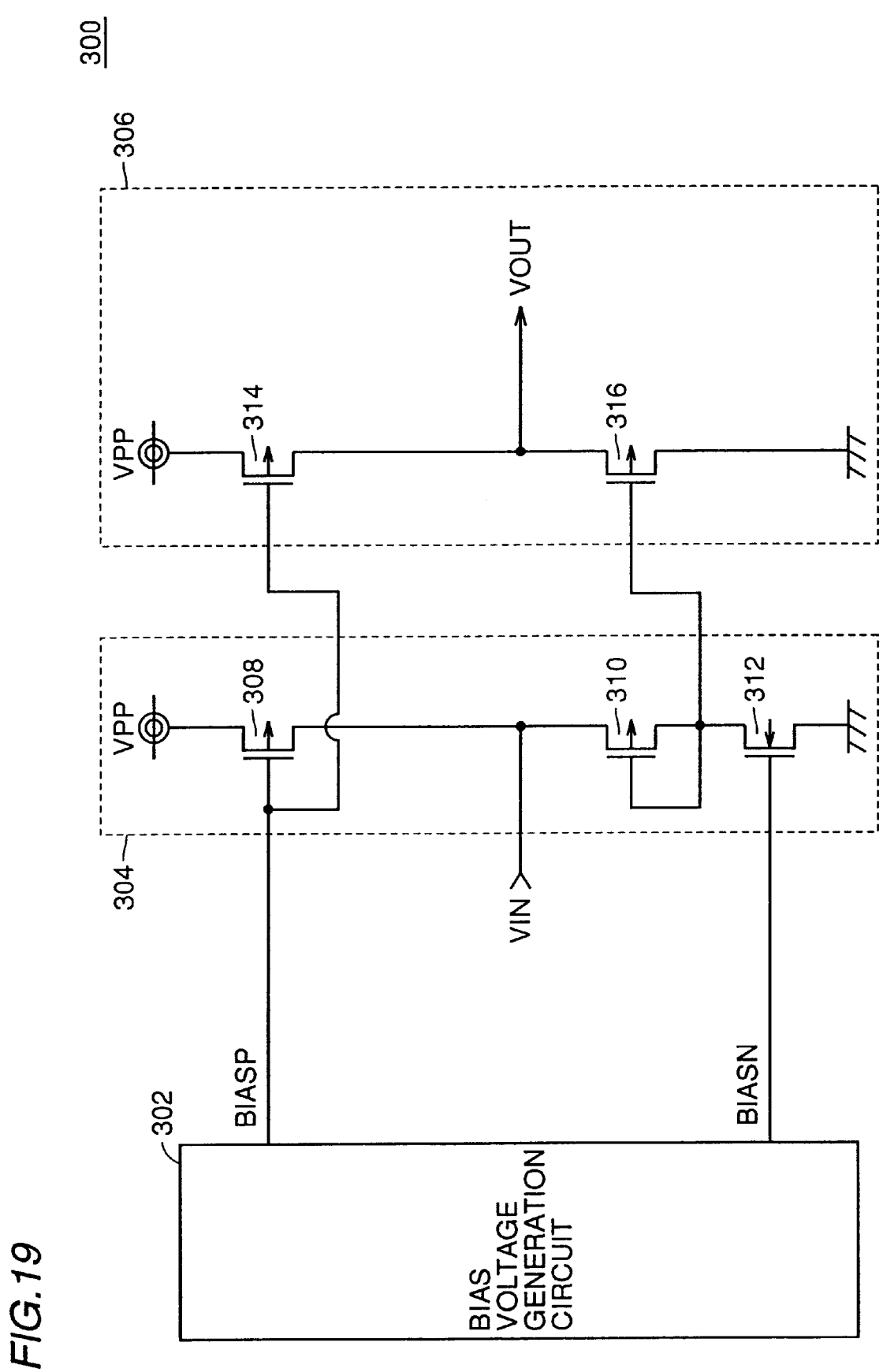
FIG. 19 is a circuit diagram representing a configuration of a voltage amplifier circuit 300 used in third embodiment.

FIG. 19 is a circuit diagram representing a configuration of a voltage amplifier circuit 300 used in third embodiment.

Referring to FIG. 19, a voltage amplifier circuit 300 includes: a bias voltage generation circuit 302 outputting the bias voltages BIASP and BIASN; a standard potential input portion 304 receiving the standard potential VIN; and a drive portion 306 receiving an output of the standard potential input portion 904 to output the output potential VOUT.

The bias voltage circuit 302 has a configuration similar to that of the bias voltage generation circuit 102 shown in FIG. 6 and the description thereof is not repeated.

The standard potential input portion 304 includes: a P channel MOS transistor 308 whose source is coupled to the boosted potential VPP, and which receives the bias voltage BIASP at the gate thereof; a P channel MOS transistor 310, whose source is connected to the drain of the P channel MOS transistor 308, and in which its gate is connected to its drain; and an N channel MOS transistor 312 that is connected between the drain of the P channel MOS transistor 310 and a ground node, and which receives the bias potential BIASN at the gate thereof.

The drive portion 306 includes: a P channel MOS transistor 314, whose source is coupled with the boosted potential VPP, and whose gate is coupled with the bias voltage BIASP; and a P channel MOS transistor 316 that is connected between the drain of the P channel MOS transistor 314 and a ground node, and whose gate is connected to the drain of the P channel MOS transistor 310.

The voltage amplifier circuit 300 has a configuration of a mirror image of the voltage amplifier circuit 200 shown in FIG. 13 and is a circuit with an improvement on characteristics of the voltage amplifier circuit 50 described in first embodiment. While the voltage amplifier circuit 200 of second embodiment is improved on characteristics when the standard potential VIN is low, the voltage amplifier circuit 300 is improved on characteristics when the standard potential VIN is high, that is when the standard potential VIN is close to the boosted potential VPP.

First Modification of Third Embodiment

Figure 20:
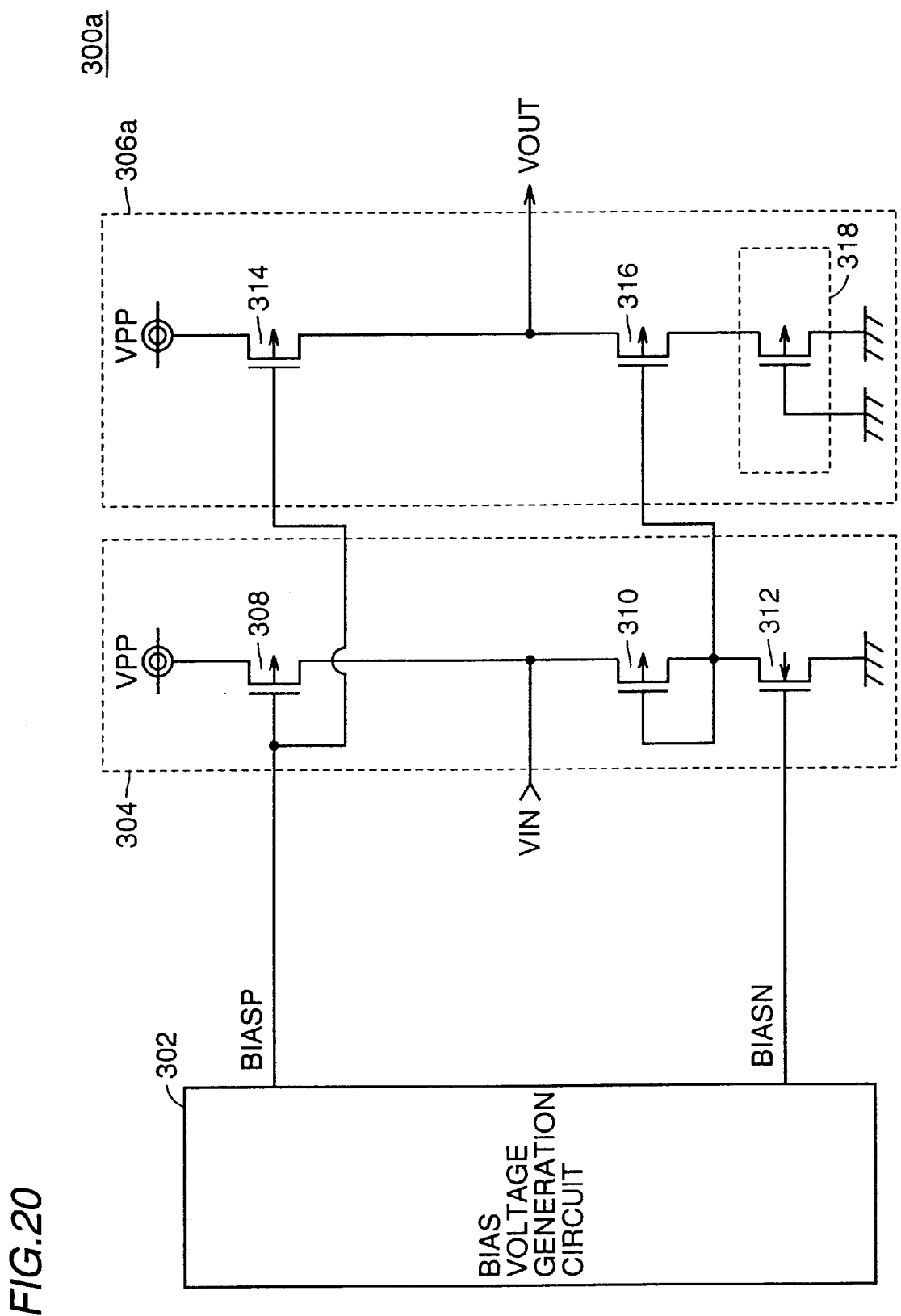
FIG. 20 is a circuit diagram representing a configuration of a voltage amplifier circuit 300a used in first modification of third embodiment.

FIG. 20 is a circuit diagram representing a configuration of a voltage amplifier circuit 300a used in first modification of third embodiment.

Referring to FIG. 20, a voltage amplifier circuit 300a is configured such that in the configuration of the voltage amplifier circuit 300 shown in FIG. 19, a drive portion 306a substitutes for the drive portion 306.

The drive portion 306a has the configuration of the drive portion 306 shown in FIG. 19 in which a P channel MOS transistor 318 is inserted between the drain of the P channel MOS transistor 316 and a ground node. The gate of the P channel MOS transistor 318 is connected to the ground node.

With such a configuration, a high voltage imposed between the source and drain of the P channel MOS transistor 316 is alleviated similar to the cases shown in FIGS. 9 and 15 and thereby, degradation of the transistor by hot carriers can be prevented from occurring.

Second Modification of Third Embodiment

Figure 21:
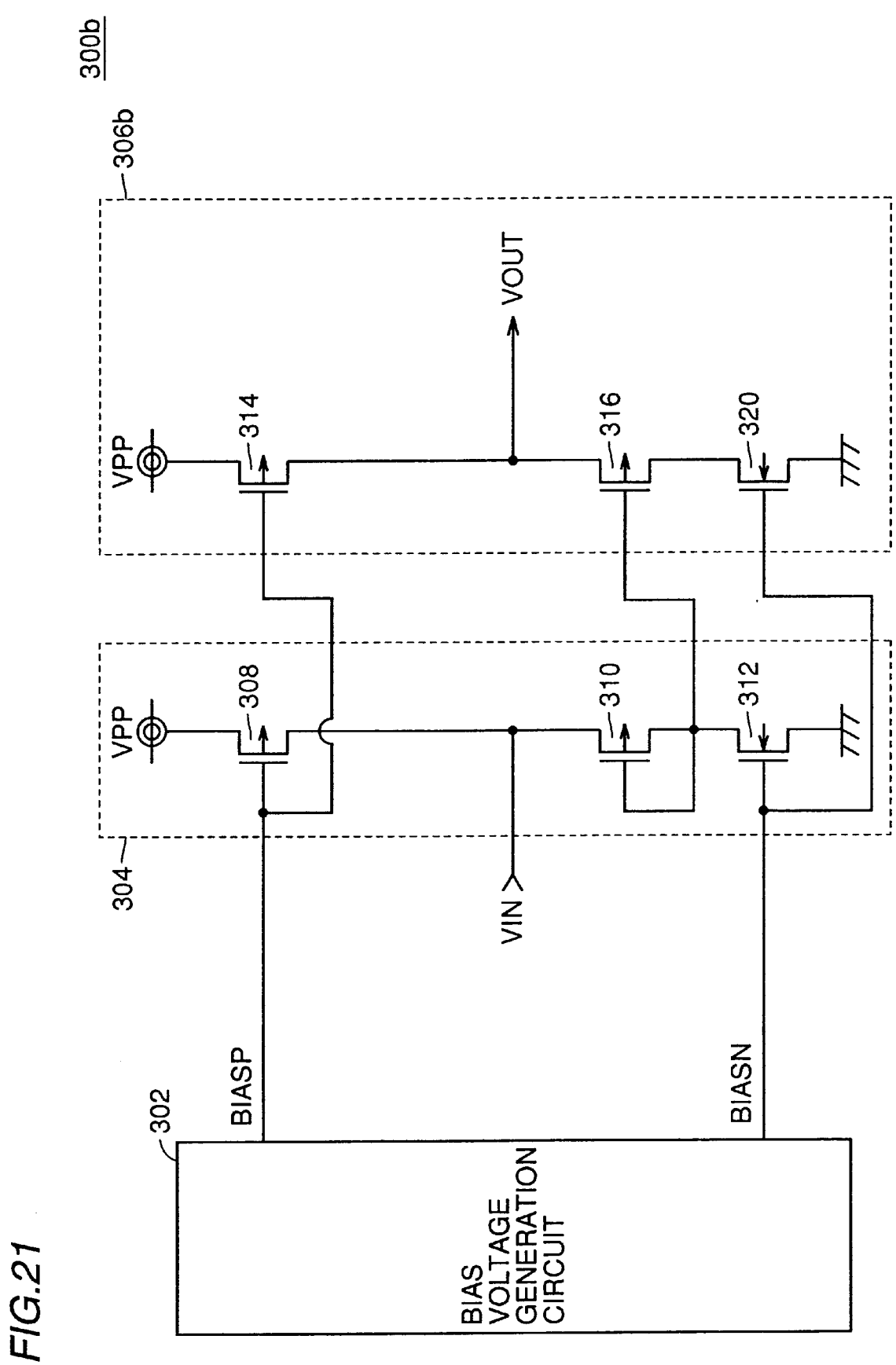
FIG. 21 is a circuit diagram representing a configuration of a voltage amplifier circuit 300b used in second modification of third embodiment.

FIG. 21 is a circuit diagram representing a configuration of a voltage amplifier circuit 300b used in second modification of third embodiment.

Referring to FIG. 21, a voltage amplifier circuit 300b has the same configuration as the voltage amplifier circuit 300 shown in FIG. 19 with the exception that the voltage amplifier circuit 300b is configured such that in the configuration of the voltage amplifier circuit 300 shown in FIG. 19, a drive portion 306b substitutes for the drive portion 306. The other part of the configuration is similar to the corresponding part of the configuration of the voltage amplifier circuit 300 and the description thereof is not repeated.

The drive portion 306b has the configuration of the drive portion 306 shown in FIG. 19 in which an N channel MOS transistor 320 is inserted between the drain of the P channel MOS transistor 316 and a ground node. The gate of the N channel MOS transistor 320 receives the bias voltage BIASN.

The voltage amplifier circuit 300b has a configuration of a mirror image of the voltage amplifier 200b shown in FIG. 16. In FIG. 21, as described in the case of FIG. 16, the maximum current flowing in the P channel MOS transistor 316 is restricted by the N channel MOS transistor 320. Therefore, even when a supply capacity of a power supply circuit is small, a change in power supply potential can be suppressed.

Third Modification of Third Embodiment

Figure 22:
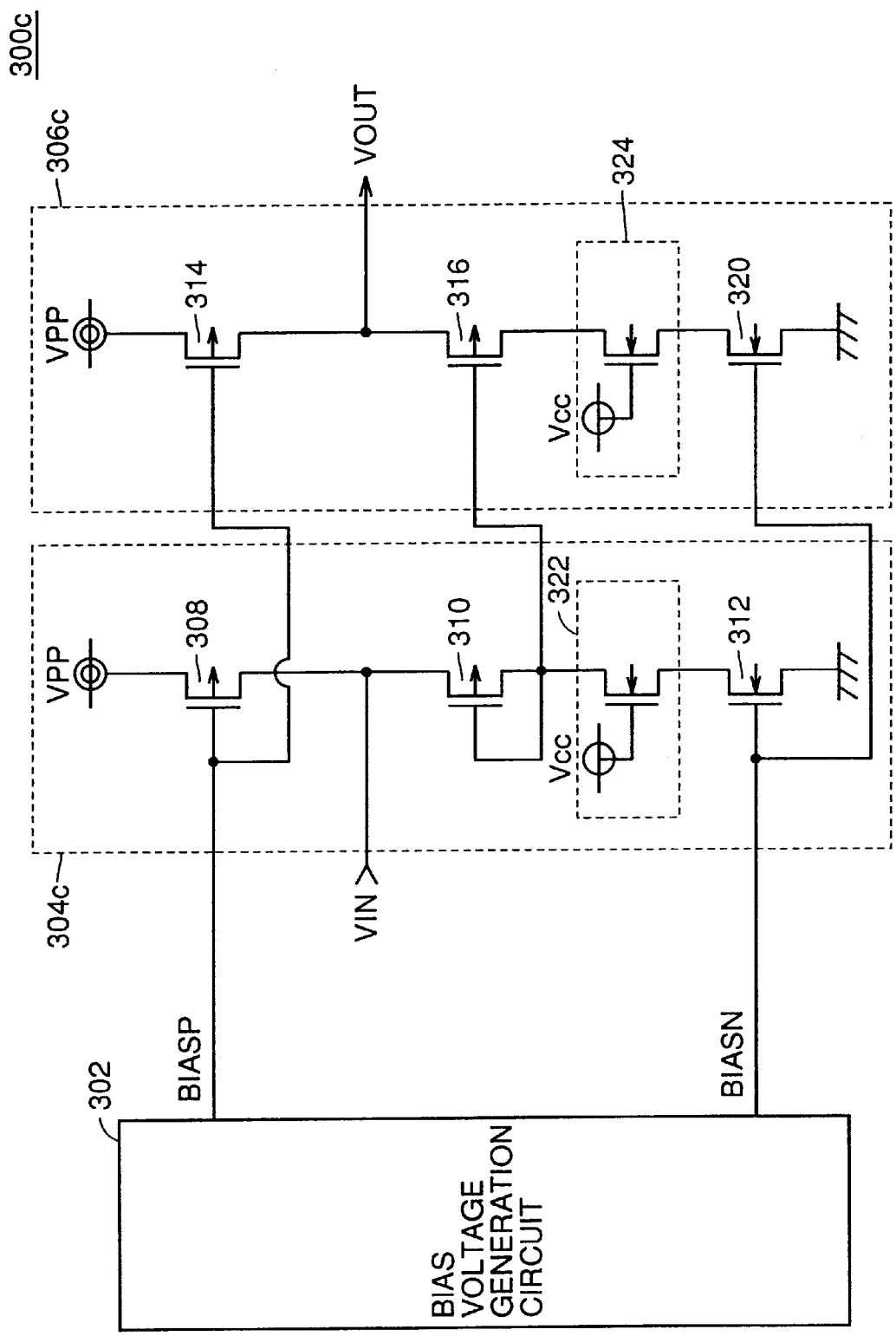
FIG. 22 is a circuit diagram representing a configuration of a voltage amplifier circuit 300c used in third modification of third embodiment.

FIG. 22 is a circuit diagram representing a configuration of a voltage amplifier circuit 300c used in third modification of third embodiment.

Referring to FIG. 22, the voltage amplifier circuit 300c has the same configuration as the voltage amplifier circuit 300b shown in FIG. 21 with the exception that the voltage amplifier circuit 300c is configured such that in the voltage amplifier circuit 300b shown in FIG. 21, a standard potential input portion 304c substitutes for the standard potential input portion 304 and a drive portion 306c substitutes for the drive portion 306b.

The standard potential input portion 304c has the configuration of the standard potential input portion 304 shown in FIG. 21 in which an N channel MOS transistor 322 is inserted between the P channel MOS transistor 310 and the N channel MOS transistor 312. The gate of the N channel MOS transistor 322 is coupled with the power supply potential Vcc.

The drive portion 306c has the configuration of the drive portion 306b shown FIG. 21 in which an N channel MOS transistor 324 is inserted between the P channel MOS transistor 316 and the N channel MOS transistor 320. The gate of the N channel MOS transistor 324 is coupled to the power supply potential Vcc. With such a configuration adopted, similar to the case of the voltage amplifier circuit 200c shown in FIG. 18, a high voltage can be alleviated in a situation such as a high voltage is imposed on a current limiting transistor.

Therefore, degradation of the transistor due to hot carriers can be prevented from occurring.

Fourth Embodiment

While the voltage amplifier circuit in first embodiment can suppress an operating current, it has a fault that a dynamic range is limited, for example, such that 1.8 V<VIN<8.2 V.

On the other hand, while the dynamic range of the voltage amplifier circuit of second embodiment can be broadened, for example, such that 0 V<VIN<8.2 V, it is less advantageous that an operating current thereof is larger. Further, while the dynamic range of the voltage amplifier circuit of third embodiment can be broadened, for example, such that 1.8 V<VIN<10 V, it is less advantageous that an operating current thereof is larger.

Therefore, when a configuration is adopted in which outputs of voltage amplifier circuits of three kinds are commonly connected and the circuits are switched over among them to operate according to a supplied standard potential VIN, not only can the dynamic range be broadened such that 0 V<VIN<10V, but an operating current can be limited to the minimum as well.

Figure 23:
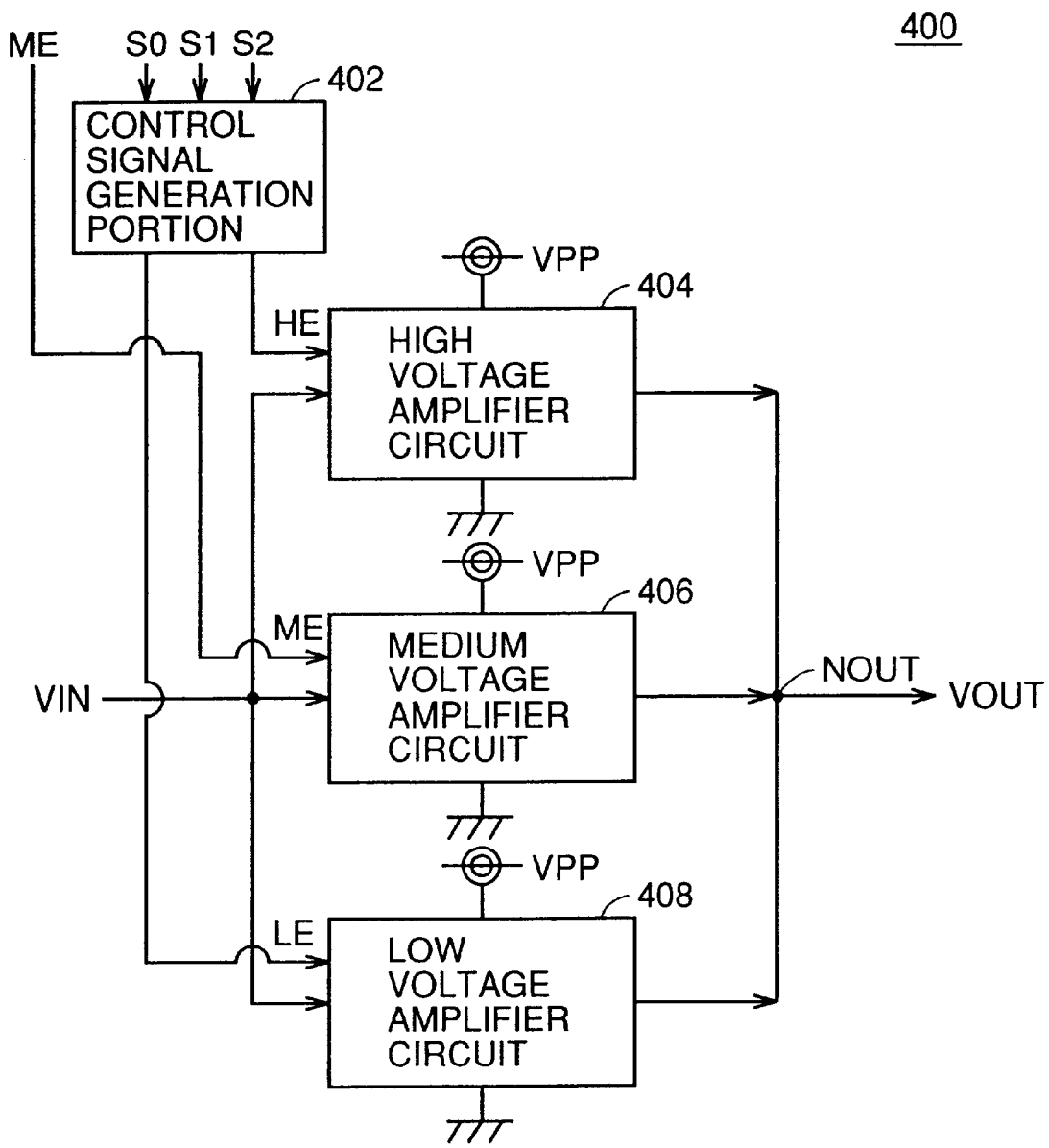
FIG. 23 is a block diagram representing a configuration of a voltage amplifier circuit 400 used in fourth embodiment.

FIG. 23 is a block diagram representing a configuration of a voltage amplifier circuit 400 used in fourth embodiment.

Referring to FIG. 23, the voltage amplifier circuit 400 includes: a control signal generation portion 402 receiving the control signals S0, S1 and S2 from a program & erase control portion 2; a high voltage amplifier circuit 404, activated according to a control signal HE to drive a node NOUT to a potential equal to the standard potential VIN; an medium voltage amplifier circuit 406 activated according to a control signal ME to drive the node NOUT to a potential equal to the standard potential VIN; and a low voltage amplifier circuit 408, activated according to a control signal LE to drive the node NOUT to a potential equal to the standard potential VIN. The voltage amplifier circuit 400 outputs the output potential VOUT from the node NOUT.

Figure 24:
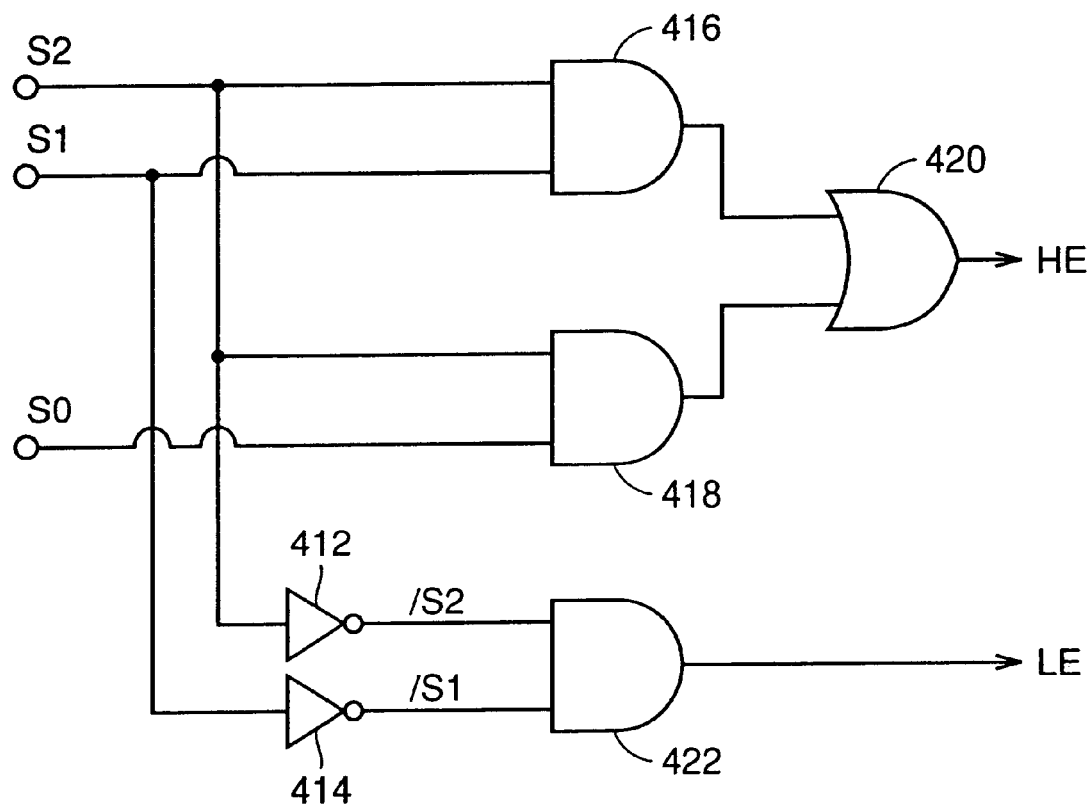
FIG. 24 is a circuit diagram representing a configuration of the control signal generation portion 402 of FIG. 23.

FIG. 24 is a circuit diagram representing a configuration of the control signal generation portion 402 of FIG. 23.

Referring to FIG. 24, the control signal generation portion 402 includes: an inverter 414 receiving the control signal S1 to invert it and output a signal /S1; an inverter 412 receiving the control signal S2 to invert it and output a signal /S2; an AND circuit 422 receiving the signals /S1 and /S2 to output the control signal LE; an AND circuit 418 receiving control signals S0 and S2; an AND circuit 416 receiving the control signals S1 and S2; and an OR circuit 420 receiving outputs of the AND circuits 416 and 418 to output the control signal HE.

Figure 25:
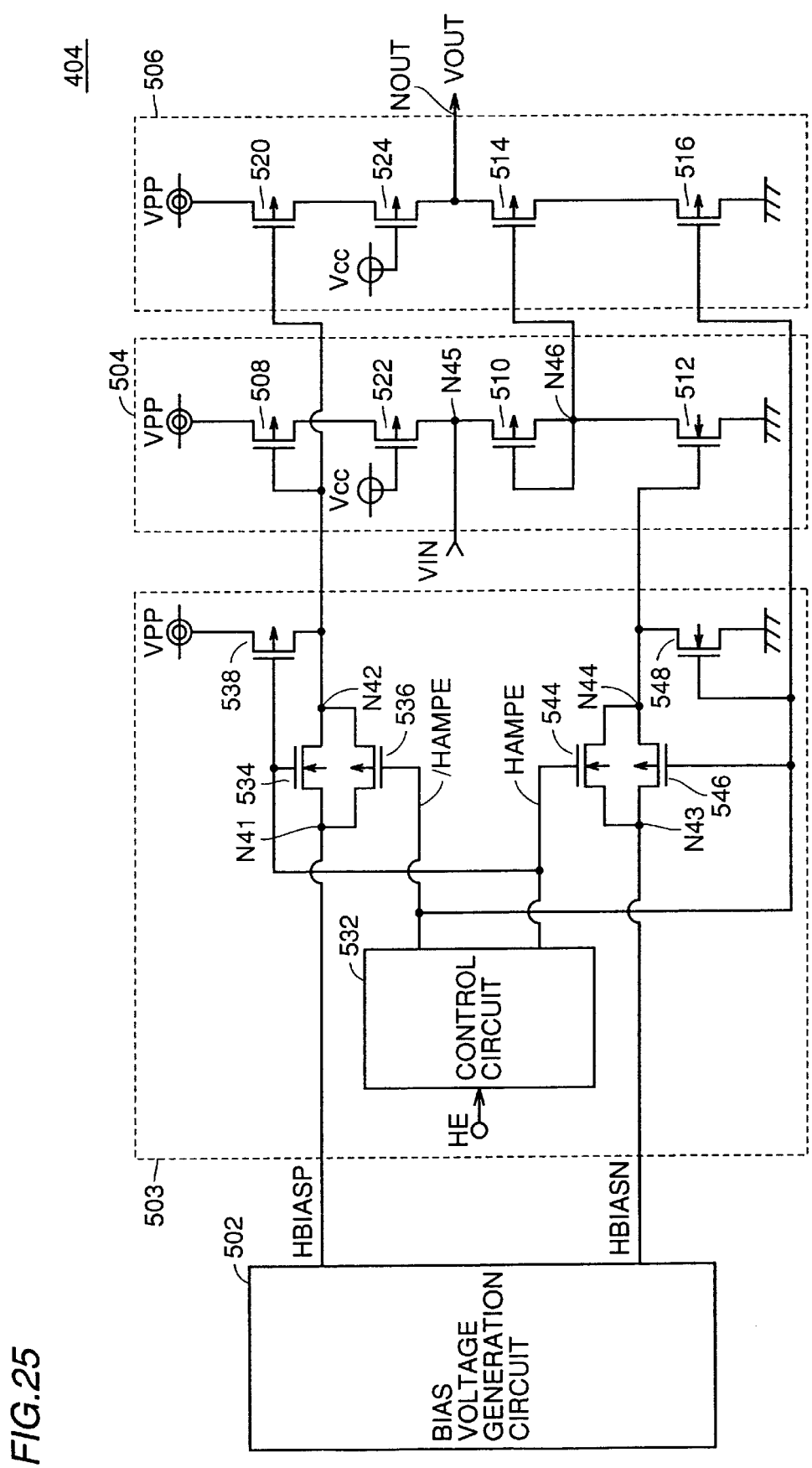
FIG. 25 is a circuit diagram representing a configuration of the high voltage amplifier circuit 404 of FIG. 23.

FIG. 25 is a circuit diagram representing a configuration of the high voltage amplifier circuit 404 of FIG. 23.

Referring to FIG. 25, the high voltage amplifier circuit 404 includes: a bias voltage generation circuit 502 outputting bias voltages HBIASP and HBIASN; a switch circuit 502 transmitting a bias voltage according to the control signal HE; a standard potential input portion 504, activated according to an output of the switch circuit 503 to transmit an output corresponding to the standard potential VIN; and a drive portion 506 receiving an output of the standard potential input portion 504 to drive the node NOUT.

The switch circuit 503 includes: a control circuit 532 receiving the control signal HE to output enable signals HAMPE and /HAMPE. When the input signal HE is at H level, the enable signal HAMPE is at the boosted potential VPP. While on the other hand, the enable signal /HAMPE is at 0 V.

When the control signal HE is at L level, the enable signal HAMPE is at 0 V while the enable signal /HAMPE is at the boosted potential VPP.

The control circuit 532 has a configuration similar to that of the selector control circuit 72 shown in FIG. 4 and therefore, the description thereof is not repeated.

The switch circuit 503 further includes: an N channel MOS transistor 534, connected between nodes N41 and N42, and receiving the enable signal HAMPE at the gate thereof; and a P channel MOS transistor 536, connected in parallel to the N channel MOS transistor 534, and receiving the enable signal /HAMPE at the gate thereof. The bias voltage HBIASP is supplied to the node N41 and when the control signal HE is at H level, the transistors 534 and 536 are conductive to transmit the bias voltage HBIASP to the node N42.

The switch circuit 503 further includes: a P channel MOS transistor 538 that receives the enable signal HAMPE at the gate thereof, whose source is connected to the boosted potential VPP, and whose drain is connected to the node N42. The P channel MOS transistor 538 is conductive when the control signal HE is at L level to couple the node N42 to the boosted potential VPP.

The switch circuit 503 further includes: an N channel MOS transistor 544, connected between nodes N43 and N44, and receiving the enable signal HAMPE at the gate thereof; and a P channel MOS transistor 546, connected in parallel to the N channel MOS transistor 544, and receiving the enable signal /HAMPE at the gate thereof. When the control signal HE is at H level, the transistors 544 and 546 are conductive to transmit the bias voltage HBIASN to the node N44.

The switch circuit 503 further includes: an N channel MOS transistor 548, receiving the enable signal /HAMPE at the gate thereof, and connected between the node N44 and a ground node. The N channel MOS transistor 548 is conductive when the control signal HE is at L level to couple the node N44 to the ground potential.

The standard potential input portion 504 includes: P channel MOS transistors 508 and 522, connected in series between a node provided with the boosted potential VPP and a node N45; a P channel MOS transistor 510 connected between the node N45 and a node N46; and an N channel MOS transistor 512 connected between the node N46 and a ground node.

The gate of the P channel MOS transistor 508 is connected to the node N42. The gate of the N channel MOS transistor 522 is coupled with the power supply potential Vcc. The gate of P channel MOS transistor 510 is connected to the node N46. The gate of the N channel MOS transistor 512 is connected to the node N44. The standard potential VIN is supplied to the node N45.

The drive portion 506 includes: P channel MOS transistors 520 and 524 connected in series between a node provided with the boosted potential VPP and the node NOUT; and P channel MOS transistors 514 and 516 connected in series between the node NOUT and a ground node. The gate of the P channel MOS transistor 520 is connected to the node N42. The gate of the P channel MOS transistor 524 is coupled to the power supply potential Vcc. The gate of the P channel MOS transistor 514 is connected to the node N46. The gate of the P channel MOS transistor 516 receives the enable signal /HAMPE.

When the control signal HE is at H level, the standard potential input portion 504 and the drive portion 506 receive the bias voltages HBIASP and HBIASN, and according to this, outputs the standard potential VIN as the output potential VOUT to the node NOUT, amplifying a drive capability in operation similar to that of the voltage amplifier circuit 300 described in FIG. 19.

A gate potential of the P channel MOS transistor 516 is at L level when the control signal HE is at H level. With this functionality, the transistor 516 operates in a fashion similar to the P channel MOS transistor 318 shown in FIG. 20, thereby alleviating a high voltage.

On the other hand, when the control signal HE is at L level, the node N42 is coupled with the boosted potential VPP and the node N44 is coupled to the ground potential and therefore, no bias current flows in the standard potential input portion 504, while further in the drive portion 506 as well, the P channel MOS transistor 520 is non-conductive and the P channel MOS transistor 516 provided with the boosted potential VPP as the enable signal /HAMPE at the gate thereof is also non-conductive, such that the node NOUT is put into the high impedance state.

Figure 26:
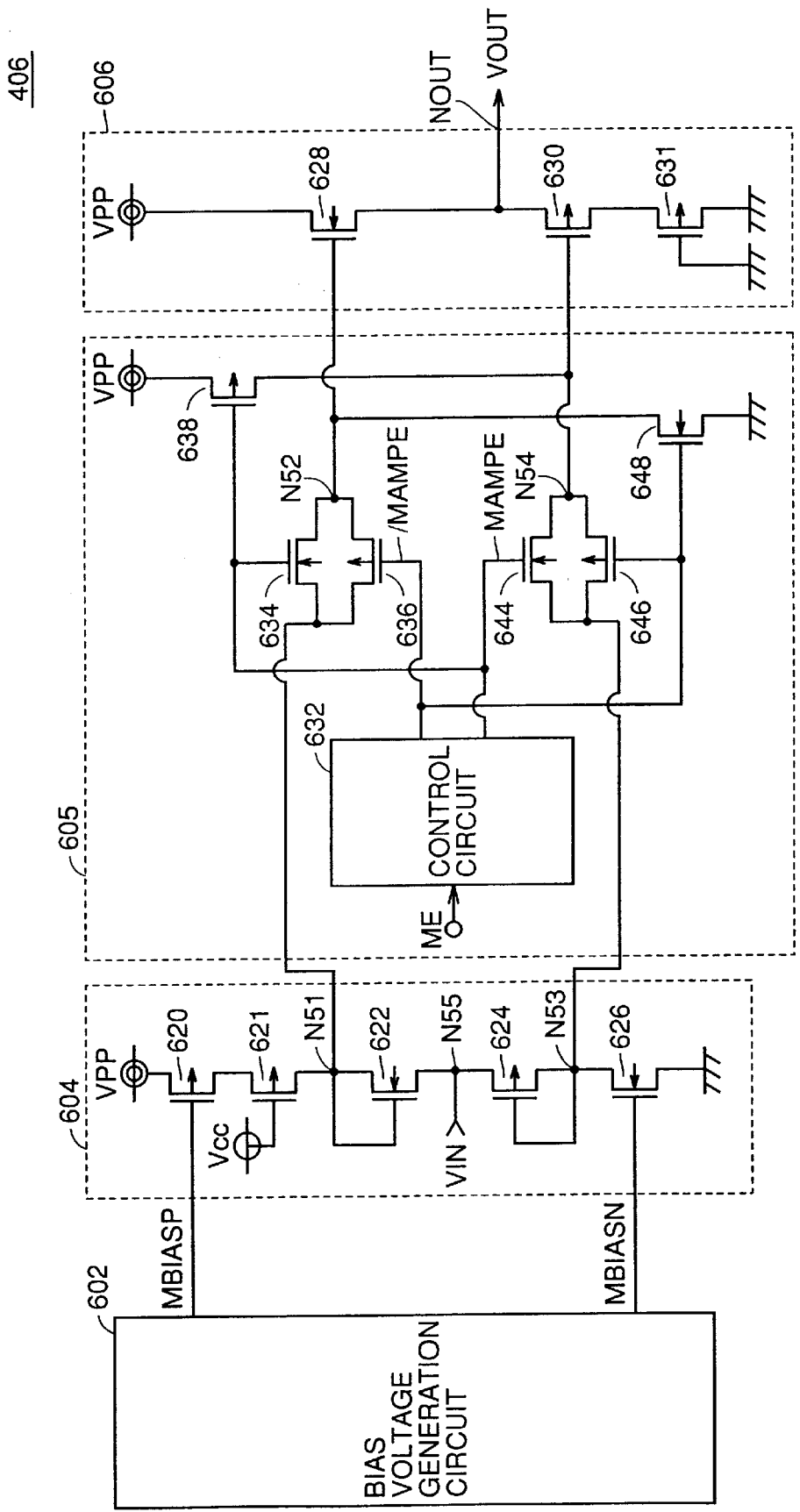
FIG. 26 is a circuit diagram representing a configuration of the medium voltage amplifier circuit 406 of FIG. 23.

FIG. 26 is a circuit diagram representing a configuration of the medium voltage amplifier circuit 406 of FIG. 23.

Referring to FIG. 26, the medium voltage amplifier circuit 406 includes: a bias voltage generation circuit 602 outputting the bias voltages MBIASP and MBIASN; a standard potential input portion 604 receiving the standard potential VIN; a drive portion 606 driving the output node NOUT to output the output potential VOUT; and a switch circuit 605 connecting the standard potential input portion 604 and the drive portion 606 with each other according the control signal ME.

The standard potential input portion 604 includes: P channel MOS transistors 620 and 621 connected in series between a node provided with the boosted potential VPP and a node N51; an N channel MOS transistor 622, whose gate and drain are connected to the node N51, and whose source is connected to a node N55; a P channel MOS transistor 624, whose source is connected to the node N55, and whose drain and gate are connected to a node N53; and an N channel MOS transistor 626, connected between the node N53 and a ground node, and receiving the bias voltage MBIASN at the gate thereof. The gate of the P channel MOS transistor 620 receives the bias voltage MBIASP. The gate of the P channel MOS transistor 621 is coupled with the power supply potential Vcc.

The switch circuit 605 includes: a control circuit 632 receiving the control signal ME to output enable signals MAMPE and /MAMPE. When the input signal ME is at H level, the enable signal MAMPE is at the boosted potential VPP while on the other hand, the enable signal /MAMPE is at 0 V.

When the control signal ME is at L level, the enable signal MAMPE is at 0 V while on the other hand, the enable signal /MAMPE is at the boosted potential VPP.

The control circuit 632 has a configuration similar to that of the selector control circuit 72 shown in FIG. 4 and therefore the description thereof is not repeated.

The switch circuit 605 further includes: an N channel MOS transistor 634 connected between the nodes N51 and N52, and receiving the enable signal MAMPE at the gate thereof; and a P channel MOS transistor 636 connected in parallel to the N channel MOS transistor 634, and receiving the enable signal /MAMPE at the gate thereof. The drain of the N channel MOS transistor 622 is connected to the node N51 and when the control signal ME is at H level, the transistors 634 and 636 are conductive to transmit a potential at the drain of the N channel MOS transistor 622 to the node N52.

The switch circuit 605 further includes: a P channel MOS transistor 638 that receives the enable signal MAMPE at the gate thereof, whose source is coupled to the boosted potential VPP, and whose drain is connected the node N54. When the control signal ME is at L level, the P channel MOS transistor 638 is conductive to couple the node N54 to the boosted potential VPP.

The switch circuit 605 further includes: an N channel MOS transistor 644 connected between the nodes N53 and N54, and receiving the enable signal MAMPE at the gate thereof; and a P channel MOS transistor 646 connected in parallel to the N channel MOS transistor 644, and receiving the enable signal /MAMPE at the gate thereof. When the control signal ME is at H level, the transistors 644 and 646 are conductive to transmit a potential of the drain of the P channel MOS transistor 624 to the node N54.

The switch circuit 605 further includes: an N channel MOS transistor 648 receiving the enable signal /MAMPE at the gate thereof, and connected between the node N52 and a ground node. When the control signal ME is at L level, the N channel MOS transistor 648 is conductive to couple the node N52 to the ground potential.

The drive portion 606 includes: an N channel MOS transistor 628 that is connected between a node provided with the boosted potential VPP and the output node NOUT, and whose gate is connected to the node N52; and P channel MOS transistors 630 and 631 connected in series between the output node NOUT and a ground node. The gate of the P channel MOS transistor 630 is connected to the node N54. The gate of P channel MOS transistor 631 is connected to the ground node.

When the control signal ME is at H level, the control circuit 632 sets the enable signal MAMPE and the enable signal /MAMPE to the boosted potential VPP and 0 V, respectively. On the other hand, when the control signal ME is at L level, the control circuit 632 outputs 0 V as the enable signal MAMPE and the boosted potential VPP as the enable signal /MAMPE.

When the control signal ME is at H level, the nodes N51 and N52 are connected to each other by an analog switch constructed of the transistors 634 and 636, and the nodes N53 and N54 are connected to each other by an analog switch constructed of the transistors G44 and 646. With such connections, the drive portion 606 performs a circuit operation similar to that of the drive portion 106 described in FIG. 6 and outputs the standard potential VIN to the node NOUT, amplifying a drive capability. On the other hand, when the control signal ME is at L level, a gate potential of the transistor 630 is coupled with the boosted potential VPP by the transistor 638 and a gate potential of the transistor 628 is coupled with the ground potential by the transistor 638. Therefore, the output node NOUT is put in the high impedance state.

Figure 27:
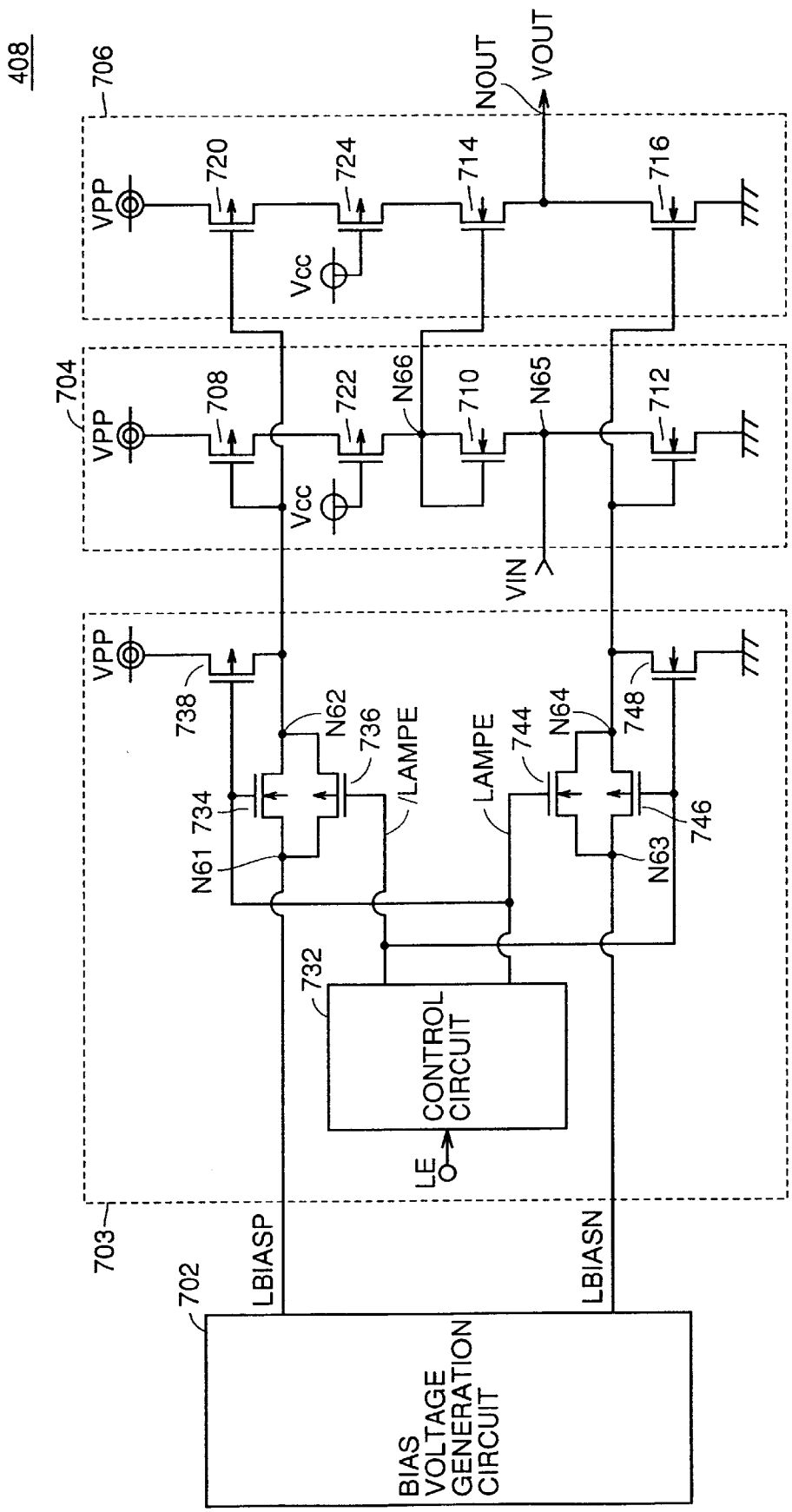
FIG. 27 is a circuit diagram representing a configuration of the low voltage amplifier circuit 408 of FIG. 23.

FIG. 27 is a circuit diagram representing a configuration of the low voltage amplifier circuit 408 of FIG. 23.

Referring to FIG. 27, the low voltage amplifier circuit 408 includes: a bias voltage generation circuit 702 outputting bias voltages LBIASP and LBIASN; a switch circuit 703 transmitting the bias voltages LBIASP and LBIASN according to a control signal LE; a standard potential input portion 704 receiving the standard potential VIN; and a drive portion 706 driving the node NOUT according to an output of the standard potential input portion 704.

The switch circuit 703 includes a control circuit 732 receiving the control signal LE to output enable signals LAMPE /LAMPE. When the input signal LE is at H level, the enable signal LAMPE is at the boosted potential VPP while on the other hand, the enable signal /LAMPE is at 0 V.

When the control signal LE is at L level, the enable signal LAMPE is at 0 V while the enable signal /LAMPE is at the boosted potential VPP.

The control circuit 732 has a configuration similar to that of the selector control circuit 72 shown in FIG. 4 and the description thereof is not repeated.

The switch circuit 703 further includes: an N channel MOS transistor 734 connected between nodes N61 and N62, and receiving the enable signal LAMPE at the gate thereof; and a P channel MOS transistor 736, connected in parallel to the N channel MOS transistor 734, and receiving the enable signal /LAMPE at the gate thereof. The bias voltage LBIASP is applied to the node N61, and when the control signal LE is at H level, the transistors 734 and 736 are conductive to transmit the bias voltage LBIASP to the node N62.

The switch circuit 703 further includes: a P channel MOS transistor 738 that receives the enable signal LAMPE at the gate thereof, whose source is coupled to the boosted potential VPP, and whose drain is connected to the node N62. When the control signal LE is at L level, the P channel MOS transistor 738 is conductive to couple the node N62 to the boosted potential VPP.

The switch circuit 703 further includes: an N channel MOS transistor 744 connected between nodes 63 and 64, and receiving the enable signal LAMPE at the gate thereof; and a P channel MOS transistor 746, connected in parallel to the N channel MOS transistor 744, and receiving the enable signal /LAMPE at the gate thereof. When the control signal LE is at H level, the transistors 744 and 746 are conductive to transmit the bias voltage LBIASN to the node N64.

The switch circuit 703 further includes: an N channel MOS transistor 748, receiving the enable signal /LAMPE at the gate thereof, and connected between the node N64 and a ground node. When the control signal LE is at L level, the N channel MOS transistor 748 is conductive to couple the node N64 to the ground potential.

The standard potential input portion 704 includes: P channel MOS transistors 708 and 722 connected in series between a node provided with the boosted potential VPP and a node N66; an N channel MOS transistor 710, whose gate and drain are connected to the node N66, and whose source is connected to the node N65; and an N channel MOS transistor 712 that is connected between the node N65 and a ground node, and whose gate is connected to the node N64. The gate of the P channel MOS transistor 708 is connected to the node N62. The gate of the P channel MOS transistor 722 is couple to the power supply potential Vcc. Further, the standard potential VIN is supplied to the node N65.

The drive portion 706 includes: P channel MOS transistors 720 and 724, and an N channel MOS transistor 714 connected in series between a node provided with the boosted potential VPP and the node NOUT; and an N channel MOS transistor 716 that is connected between the node NOUT and a ground node, and whose gate is connected to a node N64. The gate of the P channel MOS transistor 720 is connected to the node N62. The gate of the P channel MOS transistor 724 is connected to the power supply potential Vcc. The gate of the N channel MOS transistor 714 is connected to the node N66.

When the control signal LE is at H level, the control circuit 732 outputs the boosted voltage VPP as the enable signal LAMPE and 0 V as the enable signal /LAMPE. On the other hand, when the control signal LE is at L level, the control circuit 732 outputs 0V as the enable signal LAMPE and the boosted potential VPP as the enable signal /LAMPE.

When the control signal LE is at H level, an analog switch constructed of the transistors 734 and 736 are conductive to transmit the bias voltage LBIASP to the node N62. Further, when the control signal LE is at H level, an analog switch constructed of the transistors 744 and 746 transmits the bias voltage LBIASN to the node N64. By doing so, the standard potential input portion 704 and the drive portion 706 operate similar to the circuit operation described in FIG. 13 and outputs the standard potential VIN as the output potential VOUT, amplifying a drive capability thereof.

On the other hand, when the control signal LE is at L level, the node N62 is coupled with the boosted potential VPP by the P channel MOS transistor 738 and the node N64 is coupled with the ground potential by the N channel MOS transistor 748. With such coupling, since the transistors 720 and 716 of the drive portion 706 are non-conductive, the node NOUT is put in the high impedance state.

Again, referring to FIG. 23, description will be given of switch-over of a control signal. First of all, when the voltage amplifier circuit 400 is in operation, the control signal is activated at H Level. On the other hand, the voltage amplifier circuit is not in the operating mode, the control signal is set at L level to reduce power consumption. Next, when the standard potential VIN is 2.5 V or lower, the control signal LE is set to H level, while when the standard potential VIN is 3.75 V or higher, the control signal LE is set to L level. With such settings, the low voltage amplifier circuit 408 is operated outside the dynamic range of the medium voltage amplifier circuit 406, and the low voltage amplifier 408 is deactivated in the dynamic range of the medium voltage amplifier so as to reduce an operating current.

When the standard potential VIN is 7.5 V or higher, the control signal HE is set to H level, while when the standard potential VIN is 6.25 V or lower, the control signal HE is set to L level. In such a way, the high voltage amplifier circuit 404 is operated outside the dynamic range of the medium voltage amplifier circuit and the high voltage amplifier circuit 404 another according to an input potential, not only can the combined dynamic range of the voltage amplifier circuits be wider, but reduction in operating current can also realized.

It should be appreciated that while in FIGS. 25, 26 and 27, the respective bias voltage generation circuits 502, 602 and 702 are separately incorporated, no problem arises even when the circuits are replaced with a single bias voltage generation circuit in a common use with the three circuits.

Fifth Embodiment

A case arises where an applied voltage value necessary to cause a prescribed change in threshold voltage of each of a plurality of memory cells is affected so as to be different by variations in manufacturing and the like. When it is judged that a threshold voltage of a memory cell has not yet been changed to a desired one as a result of verify, that is, an operation where after a voltage is applied on the memory cell for a prescribed time, a data having been programmed on the memory cell is read out and verified, then the voltage is additionally applied for another time. A memory cell to which a voltage is necessarily applied for another time has a nature that a threshold voltage is hard to change and in this case, a higher voltage is advantageously applied in order to make it possible to shorten a time to rewrite the data. Therefore, a voltage is necessarily increased stepwise according to various rewrite characteristics of memory cells.

In order to increase a voltage applied on a memory cell stepwise, it is only required that values of the control signals S0, S1 and S2 supplied to the standard potential generation circuit shown in FIG. 3 are sequentially counted up.

Figure 28:
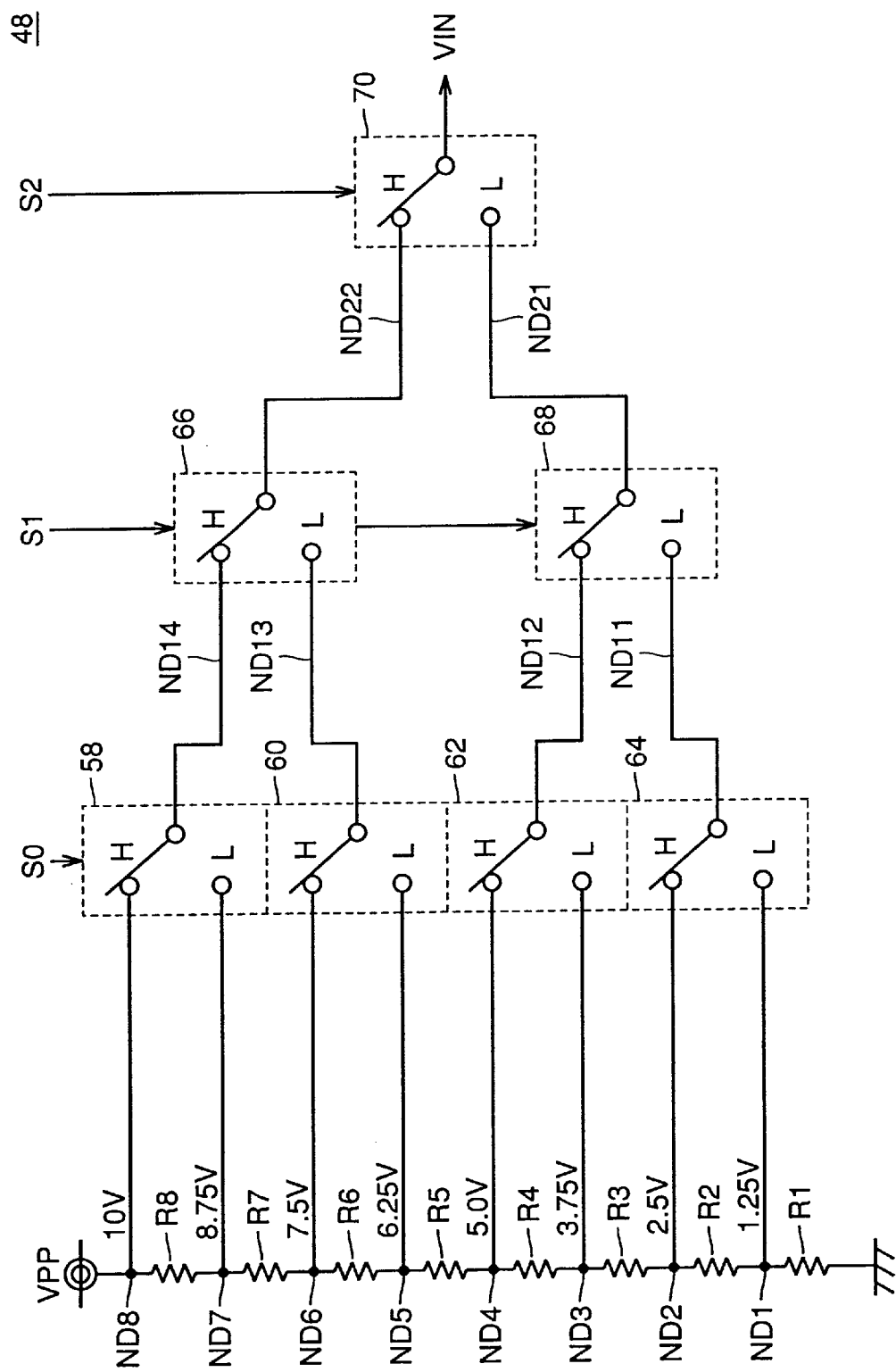
FIG. 28 is a circuit diagram representing an essence of a selector for describing operation of the standard potential generation circuit 48 shown in FIG. 3.

FIG. 28 is a circuit diagram representing an essence of a selector for describing operation of the standard potential generation circuit 48 shown in FIG. 3.

Referring to FIG. 28, the control signals S0, S1 and S2 are set to (H, H, and H) and the "H" side is selected in each stage of the selectors 58 to 70.

FIG. 29 is a table for describing changes in nodes in the case of sequential counting-up of control signals S2, S1 and S0. H, and H) and the "H" side is selected in each stage of the selectors 58 to 70.

FIG. 29 is a table for describing changes in nodes in the case of sequential counting-up of control signals S2, S1 and S0.

Referring to FIGS. 28 and 29, when the control signals (S2, S1 and S0) is sequentially increased from (L, L and L) to (H, H and H), the standard potential VIN is increased according to the sequential increase in logical level from 1.25 V to 10.00 V in steps of 1.25V as a unit increment.

In FIG. 29, a case is considered where the control signals (S2, S1 and S0) are switched over from a pattern of (L, H and H) to a pattern of (H, L and L). At this time, the standard potential VIN changes from 5.00 V to 6.25 V. Simultaneous to this change, a potential at the node ND22 is switched from 10.00 V over to 6.25 V. However, by an action of a parasitic capacitance component that the node ND22 has, noise is produced in the standard potential VIN. A problem is, in a case, caused in that the standard potential VIN becomes higher than a target value of 6.25 V.

Figure 30:
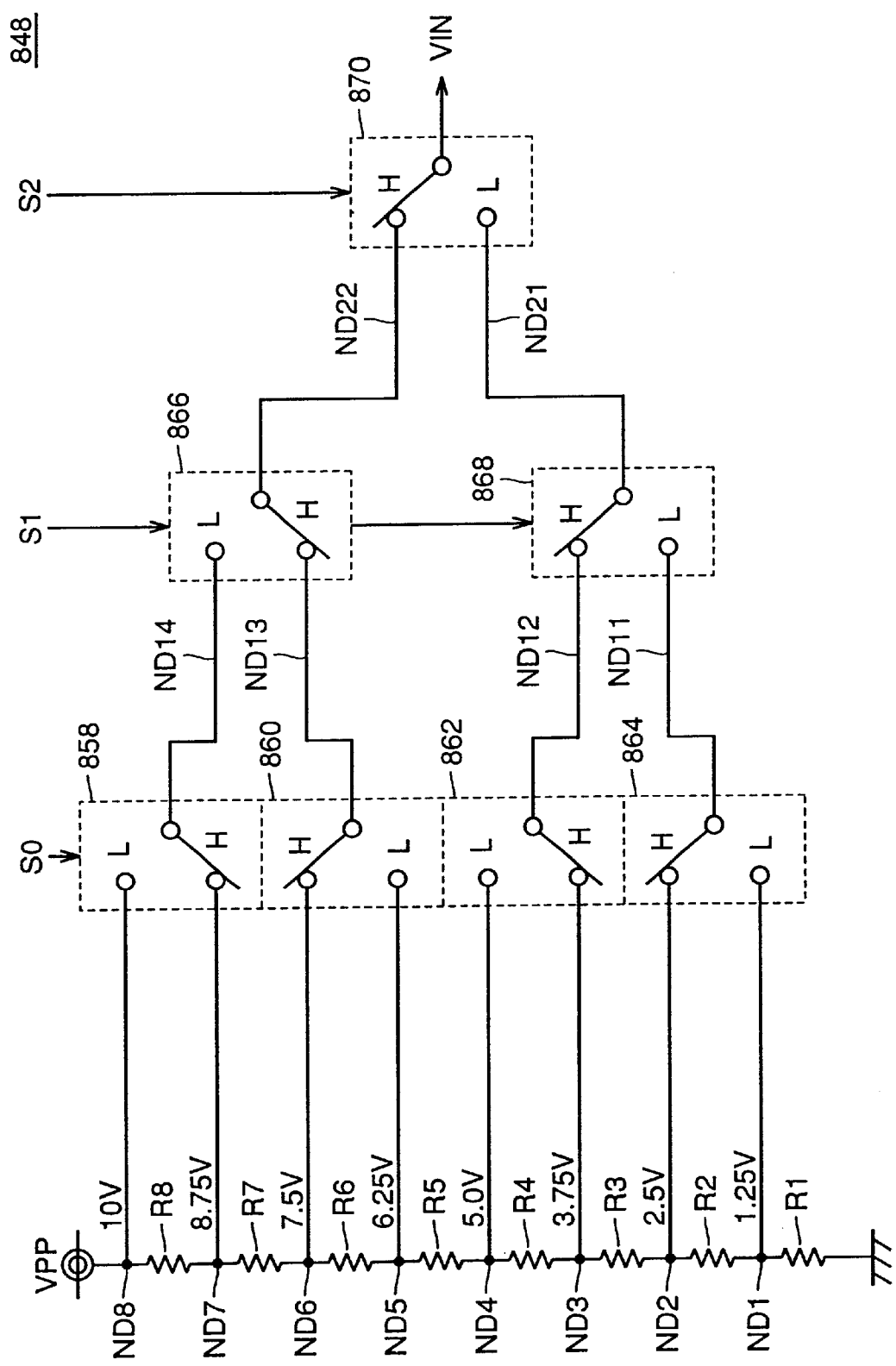
FIG. 30 is a circuit diagram schematically showing a configuration of a standard potential generation circuit 848 used in fifth embodiment.

FIG. 30 is a circuit diagram schematically showing a configuration of a standard potential generation circuit 848 used in fifth embodiment.

Referring to FIG. 30, the standard potential generation circuit 848 is configured such that in the configuration of the standard potential generation circuit 48 shown in FIG. 28, selectors 858 to 870 substitutes for the selectors 58 to 70. When the control signal S0 is at L level, the selector 858 connects node ND8 and ND14 with each other. On the other hand, when the control signal S0 is at H level, the selector 858 connects a node ND7 and the node ND14 with each other. When the control signal S0 is at H level, the selector 860 connects nodes ND6 and ND13 with each other, while when the control signal S0 is at L level, the selector 860 connects a node ND5 and the node ND13 with each other. When the control signal S0 is at L level, the selector 862 connects nodes ND4 and ND12 with each other, while when the control signal S0 is at H level, the selector 862 connects a node ND3 and the node ND12 with each other. When the control signal S0 is at H level, the selector 864 connects nodes ND2 and ND11 with each other, while when the control signal S0 is at L level, the selector 864 connects a node ND1 and the node ND11 with each other.

When the control signal S1 is at L level, the selector 8G6 connects the node ND14 and a node ND22 with each other, while when the control signal S1 is at H level, the selector 866 connects the nodes ND13 and ND22 with each other. When the control signal S1 is at H level, the selector 868 connects the node ND12 and a node ND21 with each other, while when the control signal S1 is at L level, the selector 868 connects the nodes ND11 and ND21 with each other. When the control signal S2 is at H level, the selector 870 outputs a potential at the node ND22 as the standard potential VIN, while when the control signal S2 is at L level, the selector 870 outputs a potential at the node ND2 1 as the standard potential VIN.

FIG. 31 is a table showing a relation between potentials of nodes of the standard potential generation circuit 848 shown in FIG. 30 and the control signals S0 to S2.

Referring to FIGS. 30 and 31, the standard potential generation circuit 848 uses Gray code as a select code for selectors. Gray code is characterized by the fact that the Hamming distance between a code word and its closest neighbor is one at all times. It is understood that when Gray code is adopted, potential changes of the respective nodes ND21 and ND22 are at most 1.25 V if the control signals S2, S1 and S0 are changed over to its neighboring code word. Therefore, when the control signal S2, S1 and S0 changes patterns from (L, H and L) to (H, H and L), a change in potential of each of the nodes ND21 and ND22 are suppressed small, which makes it possible to prevent occurrence of noise leading to a change in standard potential, which is unfavorably caused by an action of a parasitic capacitance.

Sixth Embodiments

In first to fourth embodiments, descriptions have been given of the cases of a constant boosted potential VPP (for example 10 V). However, there is a case where the boosted potential VPP itself generated by a charge pump circuit is changed, for example, according to operating modes such as program, erase and read. In such cases, in the standard potential generation circuit 848 shown in FIG. 30 for example, potentials at the nodes ND1 to ND8 allocated by voltage division based on the boosted potential VPP change in proportion to a magnitude of the boosted potential VPP. Therefore, since the standard potential VIN changes, a problem arise in that a correct voltage can not be attained as the output potential VOUT.

Figure 32:
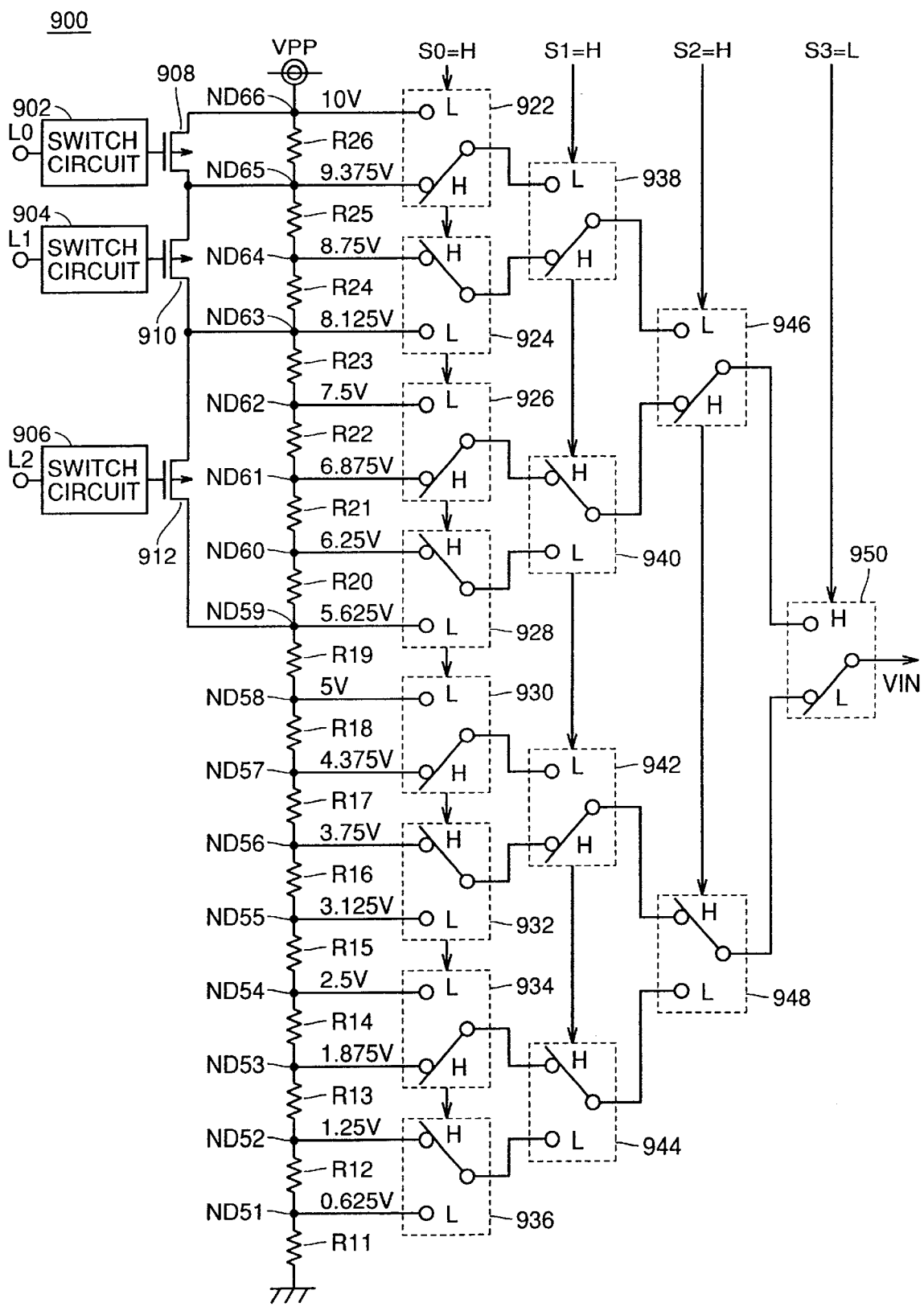
FIG. 32 is a circuit diagram representing a configuration of a standard potential generation circuit 900 of sixth embodiment.
Figure 34:
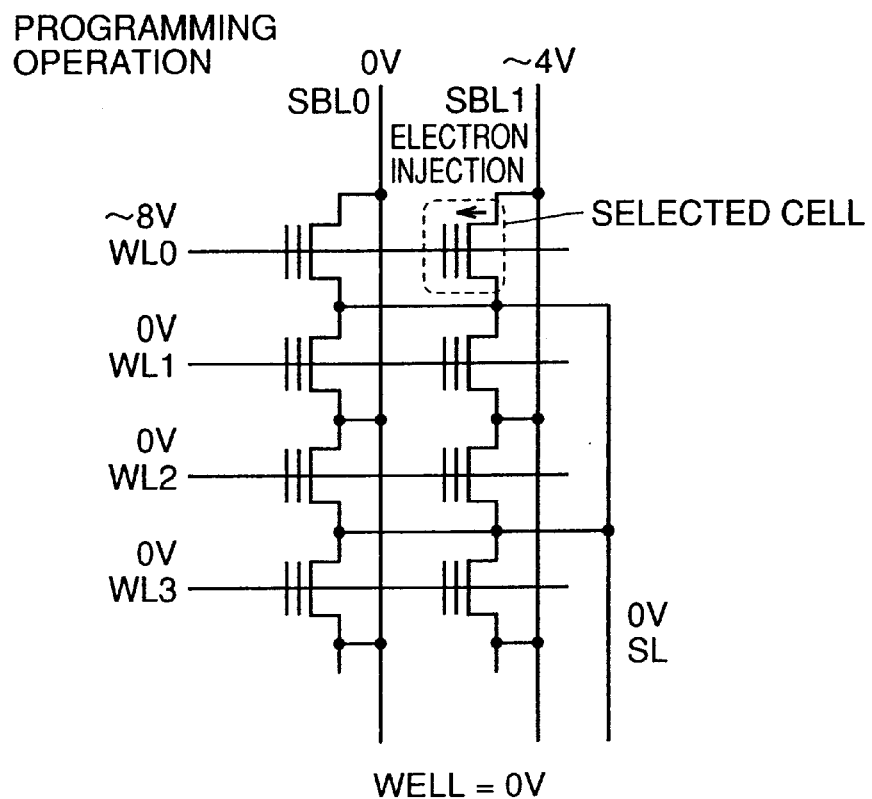
FIG. 34 is a conceptual circuit diagram for describing a programming operation on a memory cell.
Figure 35:
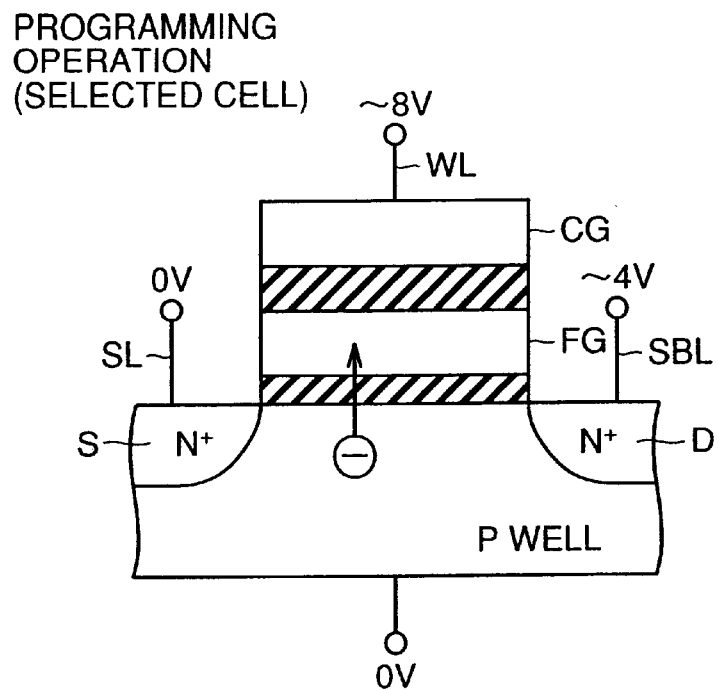
FIG. 35 is a schematic sectional view for describing a programming operation on the selected cell of FIG. 34.
Figure 36:
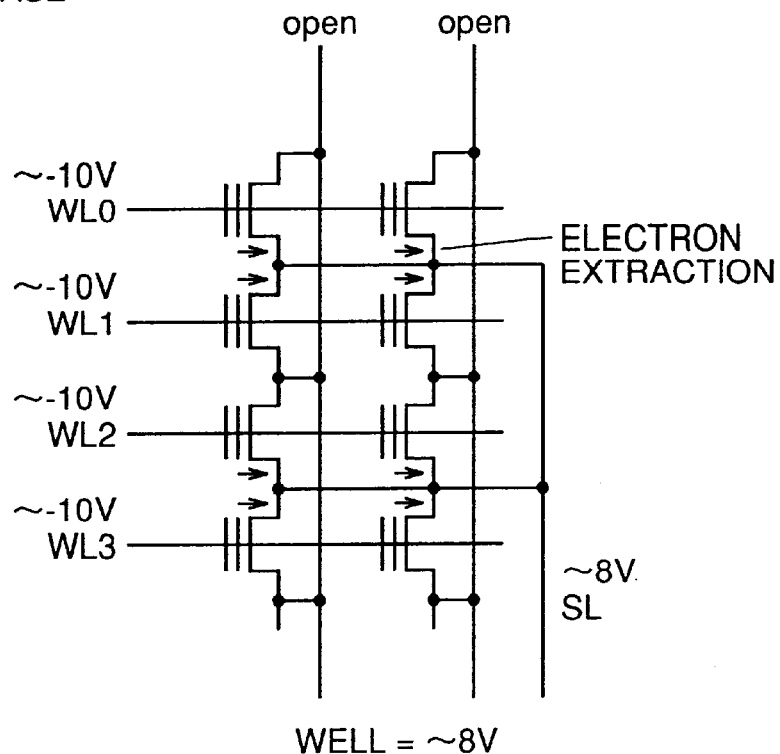
FIG. 36 is a conceptual circuit diagram for describing an erase operation on a memory cell.
Figure 37:
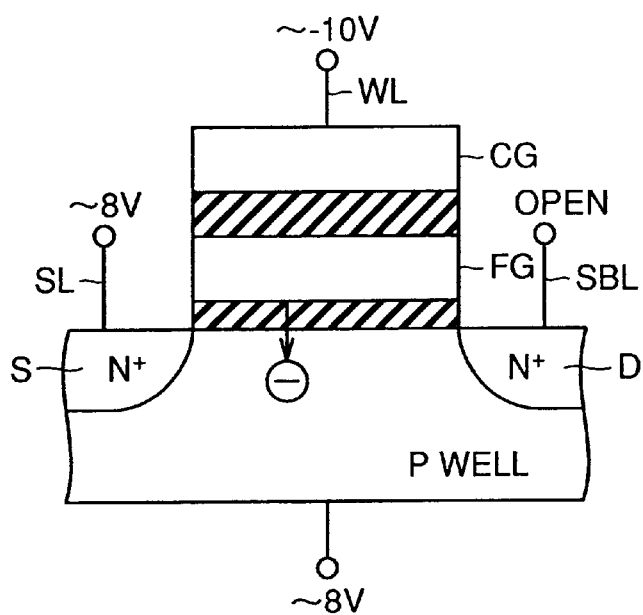
FIG. 37 is a schematic sectional view for describing a potential set on each memory transistor in an erase operation.
Figure 38:
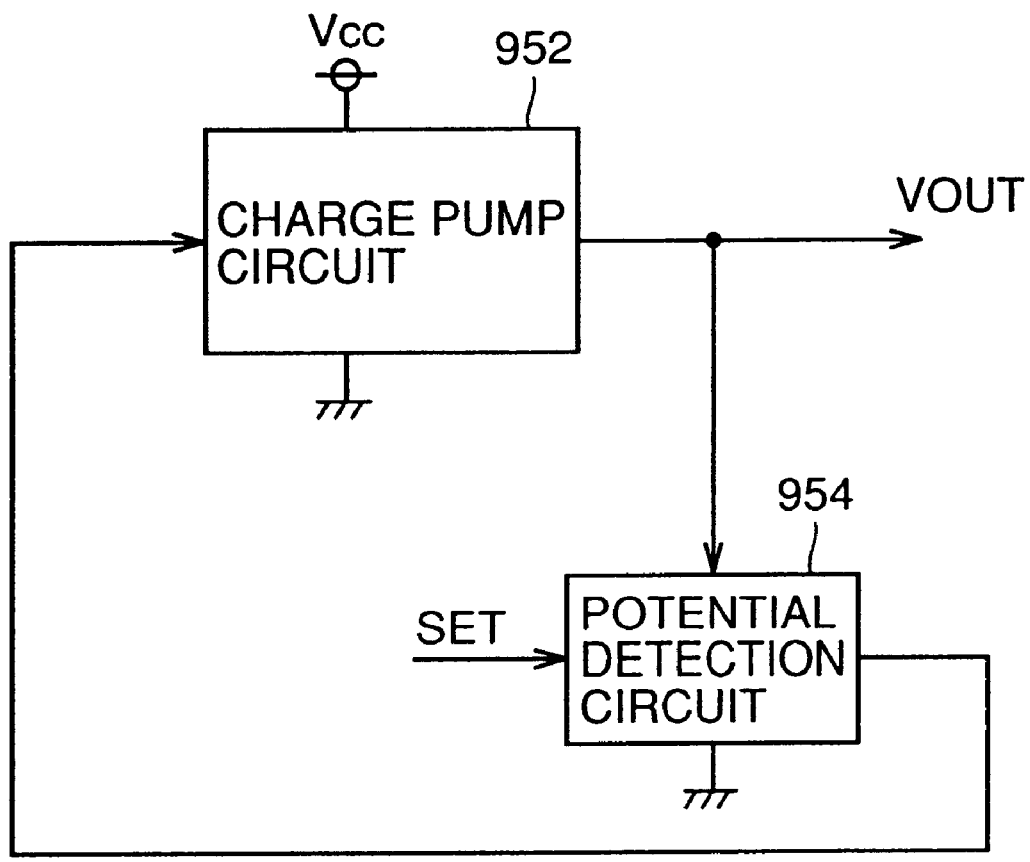
FIG. 38 is a block diagram for describing a conventional configuration whereby a plurality of high voltages are generated.

FIG. 32 is a circuit diagram representing a configuration of a standard potential generation circuit 900 of sixth embodiment.

Referring to FIG. 32, the standard potential generation circuit 900 includes: switch circuits 902, 904 and 906 receiving respective switch signals L0, L1 and L2; and P channel MOS transistors 908, 910 and 912 receiving outputs of the respective switch circuits 902, 904 and 906 at the respective gates thereof. The P channel MOS transistor 908 is connected between nodes ND66 and ND65. The P channel MOS transistor 910 is connected between the node ND65 and ND13. The P channel MOS transistor 912 is connected between the node 63 and a node 59.

The standard potential generation circuit 900 further includes: resisters R26 to RS11 connected in series between the node ND66 provided with the boosted potential VPP and a ground node. The resisters R26 to R11 each are of a resistance value of 25 kΩ.

The resister RS11 is connected between the ground node and a node ND51. The resister R12 is connected between the node ND51 and the node ND52. The resister R13 is connected between the node ND52 and the node ND53. The resister R14 is connected between the node ND53 and the node ND54. The resister R15 is connected between the node ND54 and the node ND55. The resister R16 is connected between the node ND55 and the node ND56. The resister R17 is connected between the node ND56 and the node ND57. The resister R18 is connected between the node ND57 and the node ND58.

The resister R19 is connected between the node ND58 and the node ND59. The resister R20 is connected between the node ND59 and the node ND60. The resister R21 is connected between the node ND60 and the node ND61. The resister R22 is connected between the node ND61 and the node ND62. The resister R23 is connected between the node ND62 and the node ND63. The resister R24 is connected between the node ND63 and the node ND64. The resister R25 is connected between the node ND64 and the node ND65. The resister R26 is connected between the node ND65 and the node ND66.

For example, when the boosted potential VPP is 10V, potentials outputted from the nodes ND51, ND52, ND53, ND54, ND55, ND56, ND57 and ND58 are 0.625 V, 1.25 V, 1.875 V, 2.5 V, 3.125 V, 3.75 V, 4.375 V and 5 V, respectively.

Further, potentials outputted from the nodes ND59, ND60, ND61, ND62, ND63, ND64, ND65 and ND66 are 5.625 V, 6.25 V, 6.875 V, 7.5 V, 8.125 V, 8.75 V, 9.375 V and 10 V, respectively.

The standard potential generation circuit 900 further includes: a selector 922, selecting the node ND66 when the control signal S0 is at L level, and selecting the node ND65 when at H level; a selector 924, selecting the node ND64 when the control signal S0 is at H level, and selecting the node ND63 when at L level; a selector 926, selecting the node ND62 when the control signal S0 is at L level, and selecting the node ND61 when at H level; and a selector 928, selecting the node ND60 when the control signal S0 is at H level, and selecting the node ND59 when at L level.

The standard potential generation circuit 900 further includes: a selector 930, selecting the node ND58 when the control signal S0 is at L level, and selecting the node ND57 when at H level; a selector 932, selecting the node ND56 when the control signal S0 is at H level, and selecting the node ND55 when at L level; a selector 934, selecting the node ND54 when the control signal S0 is at L level, and selecting the node ND53 when at H level; and a selector 936, selecting the node ND52 when the control signal S0 is at H level, and selecting the node ND51 when at L level.

The standard potential generation circuit 900 further includes: a selector 938, selecting an output of the selector 922 when the control signal S1 is at L level, and selecting an output of the selector 924 when at H level; a selector 940, selecting an output of the selector 924 when the control signal S1 is at H level, and selecting an output of the selector 928 when at L level; a selector 942, selecting an output of the selector 930 when the control signal S1 is at L level, and selecting an output of the selector 932 when at H level; and a selector 944, selecting an output of the selector 934 when the control signal S1 is at H level, and selecting an output of the selector 936 when at L level.

The standard potential generation circuit 900 further includes: a selector 946, selecting an output of the selector 938 when the control signal S2 is at L level, and selecting an output of the selector 940 when at H level; a selector 948, selecting an output of the selector 942 when the control signal S2 is at H level, and selecting an output of the selector 944 when at L level; a selector 950, selecting an output of the selector 946 when the control signal S3 is at H level, and selecting an output of the selector 948 when at L level, and outputting a potential at the node thereof as the standard potential VIN.

The switch circuit 902 can be a circuit similar to that of the selector control circuit 72 shown in FIG. 4. That is, when the switch signal L0 is inputted as the control signal S1 of FIG. 4 and a control signal /CONA is used as an output supplied to the gate of the P channel MOS transistor 908, the selector control circuit 72 can be used as the switch circuit 902.

The switch circuits 904 and 906 have similar configurations of the switch circuit 902 and therefore the both of descriptions thereof is not repeated.

With the configuration shown in FIG. 32 adopted, a resistance value between the nodes ND66 and ND59 can be changed in steps of 25 kΩ as a unit increment over the range of from 0Ω to 175 kΩ according to a combination of the switch signals (L2, L1 and L0). When the boosted potential VPP changes, a potential at each node already attained by voltage division can be retained as it is by changing a resistance value between the nodes ND59 and ND66.

FIG. 33 is a table for describing operation of the standard potential generation circuit shown in FIG. 32.

Referring to FIGS. 32 and 33, a case is considered, for example, where the boosted potential VPP is set to 8.125 V. In this case, when the switch signals (L2, L1 and L0) are set to a code pattern (H, L and L), the P channel MOS transistors 908 and 910 are conductive and the P channel MOS transistor 912 is non-conductive. At this time, potentials at the nodes ND66, ND65 and ND63 each are 8.125 V equal to the boosted potential VPP. In such situation, potentials of the nodes ND51 to ND63 are respective ones obtained by voltage division as imagined.

In such a way, a potential at a node obtained by voltage division can be retained at a target value by adjusting a resistance value according to a level of the boosted potential VPP, which changes according to modes such as a program mode and an erase mode.

In FIG. 33, a relation between the boosted potential VPP and upper limits of output potentials that can be imagined at respective nodes is shown with a thick line. That is, when the boosted potential VPP is 10 V, potentials are obtained at the nodes ND51 to ND66 as imagined, whereas when the boosted voltage VPP is 7.5 V, potentials are obtained only at the nodes ND51 to ND59 as imagined Therefore, even when the boosted potential VPP is changed, graded potentials at nodes obtained by voltage division can be kept constant, and an output potential can be obtained equal to that prior to the change in the boosted potential using similar control signals S0 to S3.

As shown in FIG. 32, an effect can be exerted that the upper limit of a node enabling generation of a target potential is set high by placing the P channel MOS transistor 908 short-circuiting resisters therebetween on the boosted potential VPP side according to the switch signal L0 of the least significant bit of the switch signals (L2, L1 and L0), and increasing the number of resistors which are short-circuited therebetween sequentially from the boosted potential VPP side in the ascending order of the switch signal bits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a memory array including a plurality of memory cells, arranged in a matrix pattern, and each holding a data in a nonvolatile manner;

a control portion performing control of voltage application on said plurality of memory cells according to an instruction supplied externally; and a voltage generation portion outputting a first internal potential applied on said plurality of memory cells in erasure and rewriting of said data from an output node thereof according to an output of said control portion, said voltage generation portion including:

a booster circuit raising a first power supply potential to output a second power supply potential, a standard potential generation portion generating a second internal potential according to an instruction of said control portion, and a voltage amplifier circuit receiving said second power supply potential and transmitting said first internal potential to said output node according to said second internal potential, said voltage amplifier circuit including a standard potential input portion receiving said second internal potential to output a third internal potential, and a drive portion driving a potential at said output node according to said third internal potential, said standard potential input portion including a first field effect transistor the source of which is coupled to said second internal potential, and the drain and gate of which are coupled to said third internal potential, and a first current source, provided between a first internal node applied with a prescribed power supply potential and said first field effect transistor, and supplying a prescribed first bias current to said first field effect transistor, and said drive portion including a second field effect transistor, whose gate is connected to a gate of said first field effect transistor, and which is provided on a path connecting a second internal node applied with a prescribed power supply potential and said output node.

2. The nonvolatile semiconductor memory device according to claim 1, wherein said first and second internal nodes are coupled with said second power supply potential, wherein said standard potential input portion further includes:

a third field effect transistor, the source of which is coupled with said second internal potential, and the drain and gate of which are coupled with a fourth internal potential; and a second current source, provided between a ground node and a drain of said third field effect transistor, and supplying a prescribed second bias current, and wherein said drive portion further includes a fourth field effect transistor, whose gate is connected to a gate of said third field effect transistor, and which is provided on a path connecting said ground node and said output node.

3. The nonvolatile semiconductor memory device according to claim 2, wherein said first and second field effect transistors are N channel MOS transistors and said third and fourth field effect transistors are P channel MOS transistors.

4. The nonvolatile semiconductor memory device according to claim 1, wherein said first and second internal nodes are coupled with said second power supply potential, wherein said standard potential input portion further includes:

a second current source forcing said first bias current to flow to a ground node from a source of said first field effect transistor, and wherein said drive portion further includes a third current source forcing a second bias current to said ground node from said output node.

5. The nonvolatile semiconductor memory device according to claim 4, wherein said first and second field effect transistors are N channel MOS transistors.

6. The nonvolatile semiconductor memory device according to claim 1, wherein said first and second internal nodes are coupled with a ground node, wherein said standard potential input portion further includes a second current source forcing said first bias current to flow to a source of said first field effect transistor from a node provided with said second power supply potential, and wherein said drive portion further includes a third current source forcing a second bias current to flow to said output node from a node provided with said second power supply potential.

7. The nonvolatile semiconductor memory device according to claim 6, wherein said first and second field effect transistors are P channel MOS transistors.

8. The nonvolatile semiconductor memory device according to claim 1, wherein said drive portion further includes a current limiting circuit, provided on a path connecting said second internal node and said output node in series to said second field effect transistor, and limiting a current flowing said second field effect transistor when the current exceeds a prescribed value.

9. The nonvolatile semiconductor memory device according to claim 1, wherein said drive portion further includes:

a fifth field effect transistor in diode connection, provided on a path connecting said second internal node and said output node in series to said second field effect transistor.

10. The nonvolatile semiconductor memory device according to claim 1, wherein said drive portion further includes a sixth field effect transistor, provided on a path connecting said second internal node and said output node in series to said second field effect transistor, and receiving said first power supply potential at a gate thereof.

11. The nonvolatile semiconductor memory device according to claim 1, wherein said standard potential generation portion includes:

a voltage divider circuit dividing a difference between said second power supply potential and a ground potential to output graded potentials to a plurality of partial voltage nodes; and a selector circuit, receiving an output of a voltage divider circuit, and selecting one of said graded potentials at said plurality of partial voltage nodes according to an output of said control portion, and wherein said selector circuit includes a plurality of cascaded selecting stages, the number of output nodes of each selecting stage decreasing toward the final output.

12. The nonvolatile semiconductor memory device according to claim 11, wherein an output of said control portion includes:

potential instruction information of a plurality of bits corresponding to said second internal potential in order to increase said second internal potential stepwise, wherein said selecting stages include a plurality of 2-input selectors, and wherein said selector circuit performs a select operation corresponding to said potential instruction information using a code word with a hamming distance of 1.

13. The nonvolatile semiconductor memory device according to claim 11, wherein said control portion issues an instruction to said booster circuit such that said booster circuit changes said second power supply potential according to an operating mode and supplies said standard potential generation portion with potential change information to notify said standard potential generation portion of a change in said second power supply potential, wherein said voltage divider circuit includes a group of resisters connected in series between a node provided with said second power supply potential and a ground node, a plurality of connection nodes of said group of resisters being said plurality of partial voltage nodes, and wherein said standard potential generation portion further includes a variable voltage divider circuit selectively connecting said plurality of partial voltage nodes according to said potential change information to adjust said graded potentials.

14. The nonvolatile semiconductor memory device according to claim 13, wherein said potential change information includes a plurality of signal bits, said variable voltage divider circuit includes: a plurality of switch circuits rendered conductive according to said plurality of signal bits, respectively, and connecting corresponding pairs among said plurality of partial voltage nodes, and said plurality of switch circuits are sequentially assigned to partial voltage nodes from the closest to said second power supply potential to a farther, starting from the least significant bit of said corresponding signal bits in the ascending order.

* * * * *